(12) United States Patent
Tran

(10) Patent No.: US 12,217,165 B2
(45) Date of Patent: Feb. 4, 2025

(54) CONCURRENT WRITE AND VERIFY OPERATIONS IN AN ANALOG NEURAL MEMORY

(71) Applicant: Silicon Storage Technology, Inc., San Jose, CA (US)

(72) Inventor: Hieu Van Tran, San Jose, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 949 days.

(21) Appl. No.: 17/190,376

(22) Filed: Mar. 2, 2021

(65) Prior Publication Data

US 2022/0067499 A1 Mar. 3, 2022

Related U.S. Application Data

(60) Provisional application No. 63/070,051, filed on Aug. 25, 2020.

(51) Int. Cl.
| | | |
|---|---|---|
| *G11C 16/24* | (2006.01) | |
| *G06N 3/065* | (2023.01) | |
| *G11C 11/40* | (2006.01) | |
| *G11C 16/10* | (2006.01) | |
| *G11C 16/12* | (2006.01) | |
| *G11C 16/26* | (2006.01) | |

(52) U.S. Cl.
CPC ............. *G06N 3/065* (2023.01); *G11C 11/40* (2013.01); *G11C 16/10* (2013.01); *G11C 16/12* (2013.01); *G11C 16/24* (2013.01); *G11C 16/26* (2013.01)

(58) Field of Classification Search
CPC ........ G06N 3/065; G06N 3/045; G11C 11/40; G11C 16/10; G11C 16/12; G11C 16/24; G11C 16/26; G11C 11/54; G11C 16/3459
See application file for complete search history.

(56) References Cited

U.S. PATENT DOCUMENTS

| | | |
|---|---|---|
| 5,029,130 A | 7/1991 | Yeh |
| 6,215,705 B1 | 4/2001 | Al-shamma |
| (Continued) | | |

FOREIGN PATENT DOCUMENTS

| | | |
|---|---|---|
| JP | 2002 133899 | 5/2002 |
| JP | 2010 113742 | 5/2010 |
| (Continued) | | |

OTHER PUBLICATIONS

PCT Search Report & Written Opinion for the related PCT Patent Application No. US2021/020963.

(Continued)

*Primary Examiner* — Jay W. Radke
(74) *Attorney, Agent, or Firm* — DLA PIPER LLP US

(57) ABSTRACT

Numerous embodiments of analog neural memory systems that enable concurrent write and verify operations are disclosed. In some embodiments, concurrent operations occur among different banks of memory. In other embodiments, concurrent operations occur among different blocks of memory, where each block comprises two or more banks of memory. The embodiments substantially reduce the timing overhead for weight writing and verifying operations in analog neural memory systems.

8 Claims, 22 Drawing Sheets

(56) References Cited

U.S. PATENT DOCUMENTS

| | | | | |
|---|---|---|---|---|
| 6,310,805 | B1* | 10/2001 | Kasa | G11C 29/702 |
| | | | | 365/230.06 |
| 6,747,310 | B2 | 6/2004 | Fan | |
| 7,197,607 | B2 | 3/2007 | Roohparvar | |
| 2001/0053091 | A1 | 12/2001 | Futatsuya | |
| 2010/0103723 | A1* | 4/2010 | Kawai | G11C 11/56 |
| | | | | 365/163 |
| 2010/0118592 | A1 | 5/2010 | Ishihara | |
| 2012/0155162 | A1 | 6/2012 | Hanzawa | |
| 2015/0310904 | A1* | 10/2015 | Kim | G11C 11/1659 |
| | | | | 365/158 |
| 2016/0093341 | A1* | 3/2016 | Alam | G11C 5/063 |
| | | | | 365/189.011 |
| 2017/0337466 | A1 | 11/2017 | Bayat et al. | |
| 2017/0358357 | A1* | 12/2017 | Hung | G11C 16/16 |
| 2020/0065650 | A1 | 2/2020 | Tran | |
| 2021/0074365 | A1* | 3/2021 | Dinh | G11C 7/1042 |

FOREIGN PATENT DOCUMENTS

| | | |
|---|---|---|
| JP | 2012 128918 | 7/2012 |
| TW | 200421348 A | 10/2004 |

OTHER PUBLICATIONS

Taiwanese Search Report dated May 2, 2022 corresponding to the related Taiwanese Patent Application No. 110127811.
Japanese Notice of Reasons for Rejection mailed on Mar. 12, 2024 corresponding to the Japanese Patent Application No. 2023-512707.
S. Korean Notice of Rejection mailed on Apr. 15, 2024 corresponding to the related S. Korean Patent Application No. 10-2023-7003332. (English machine translations using Google Translate).
European Examiner's Report mailed on May 17, 2024 corresponding to the related European Patent Application No. 21 716 877.2.

* cited by examiner

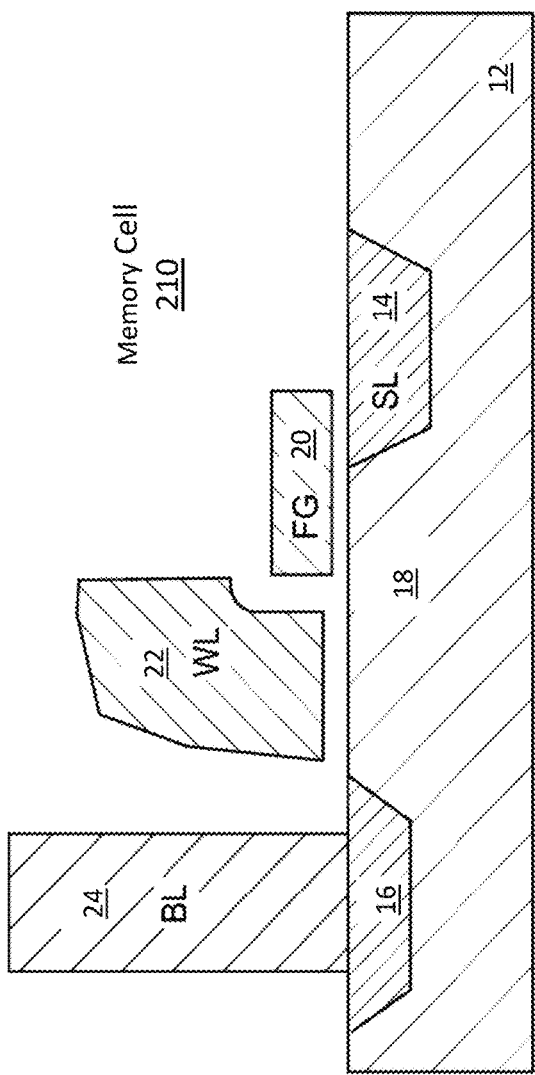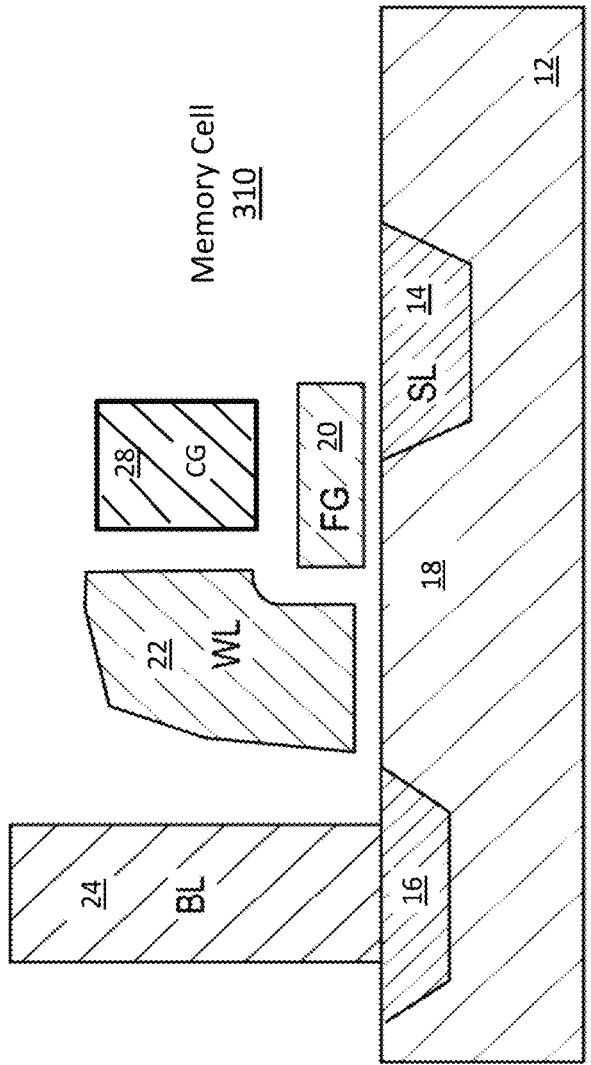
FIGURE 2
(PRIOR ART)
FIGURE 3
(PRIOR ART)

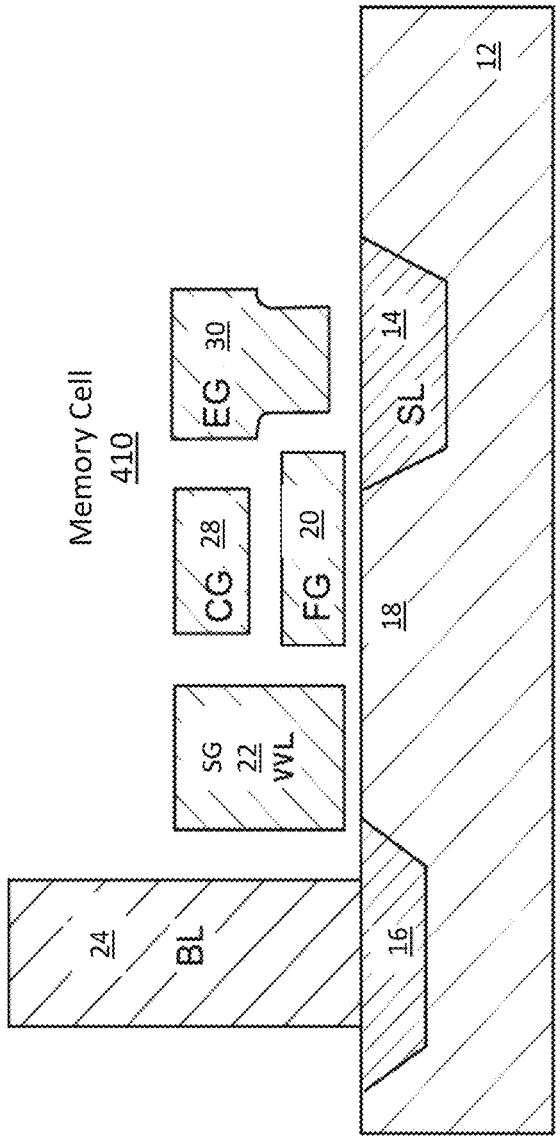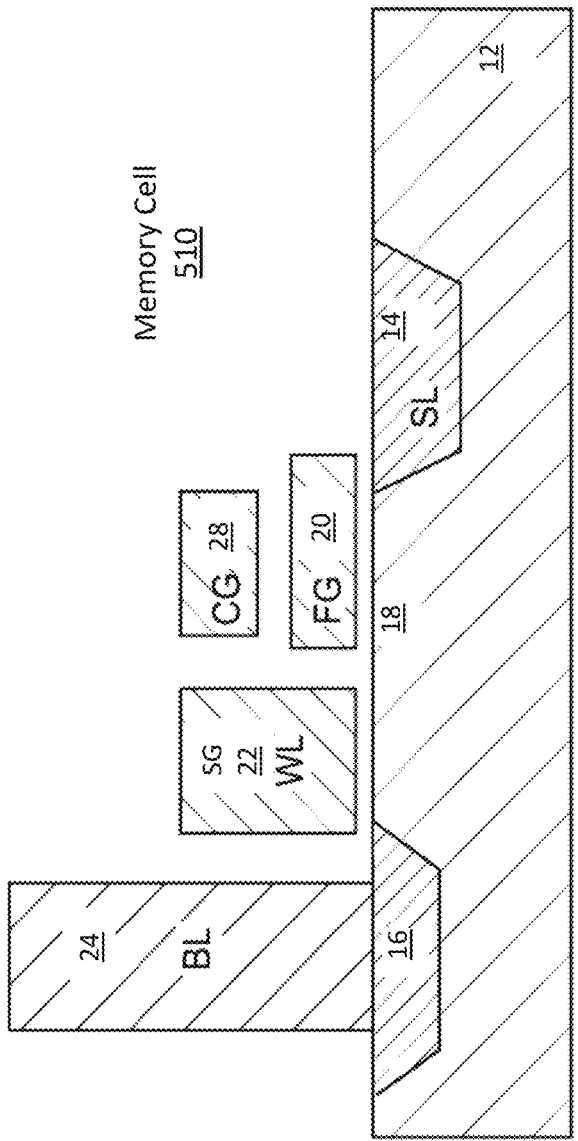
FIGURE 4
(PRIOR ART)
FIGURE 5
(PRIOR ART)

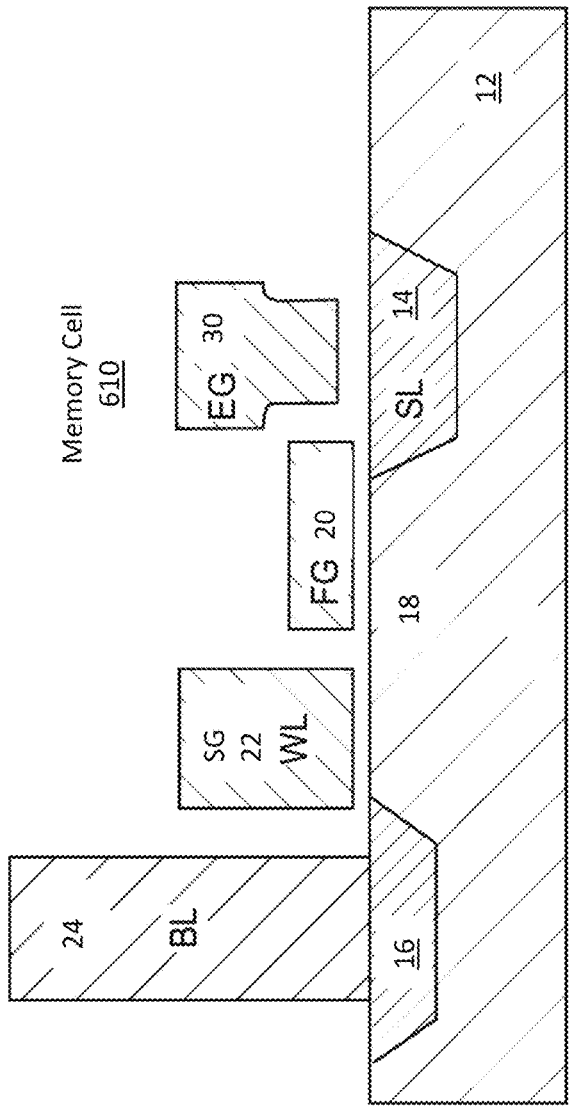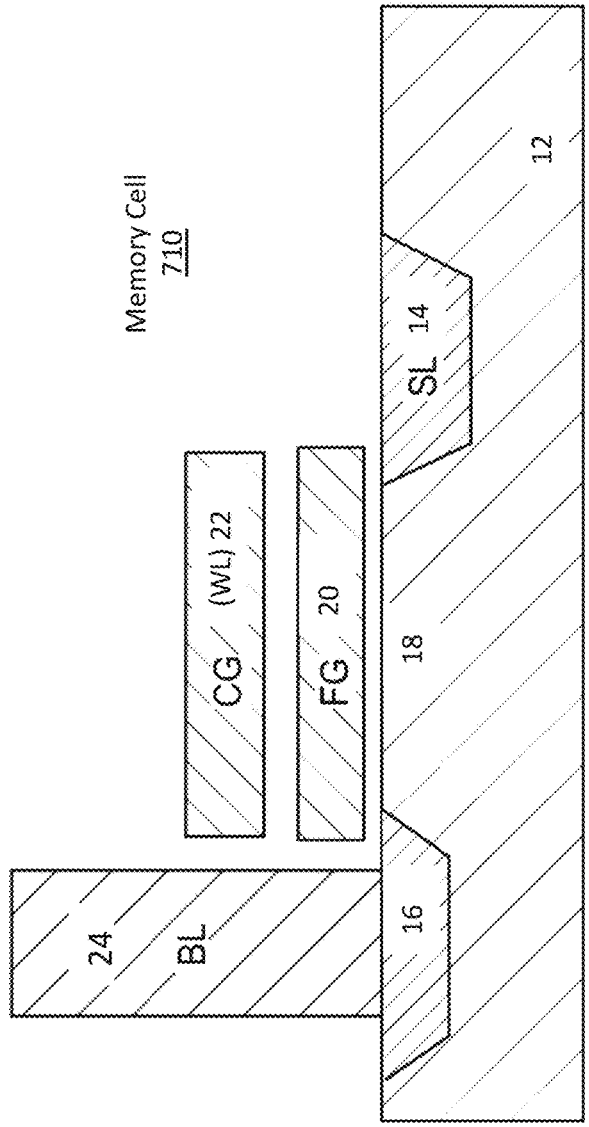
FIGURE 6
(PRIOR ART)
FIGURE 7
(PRIOR ART)

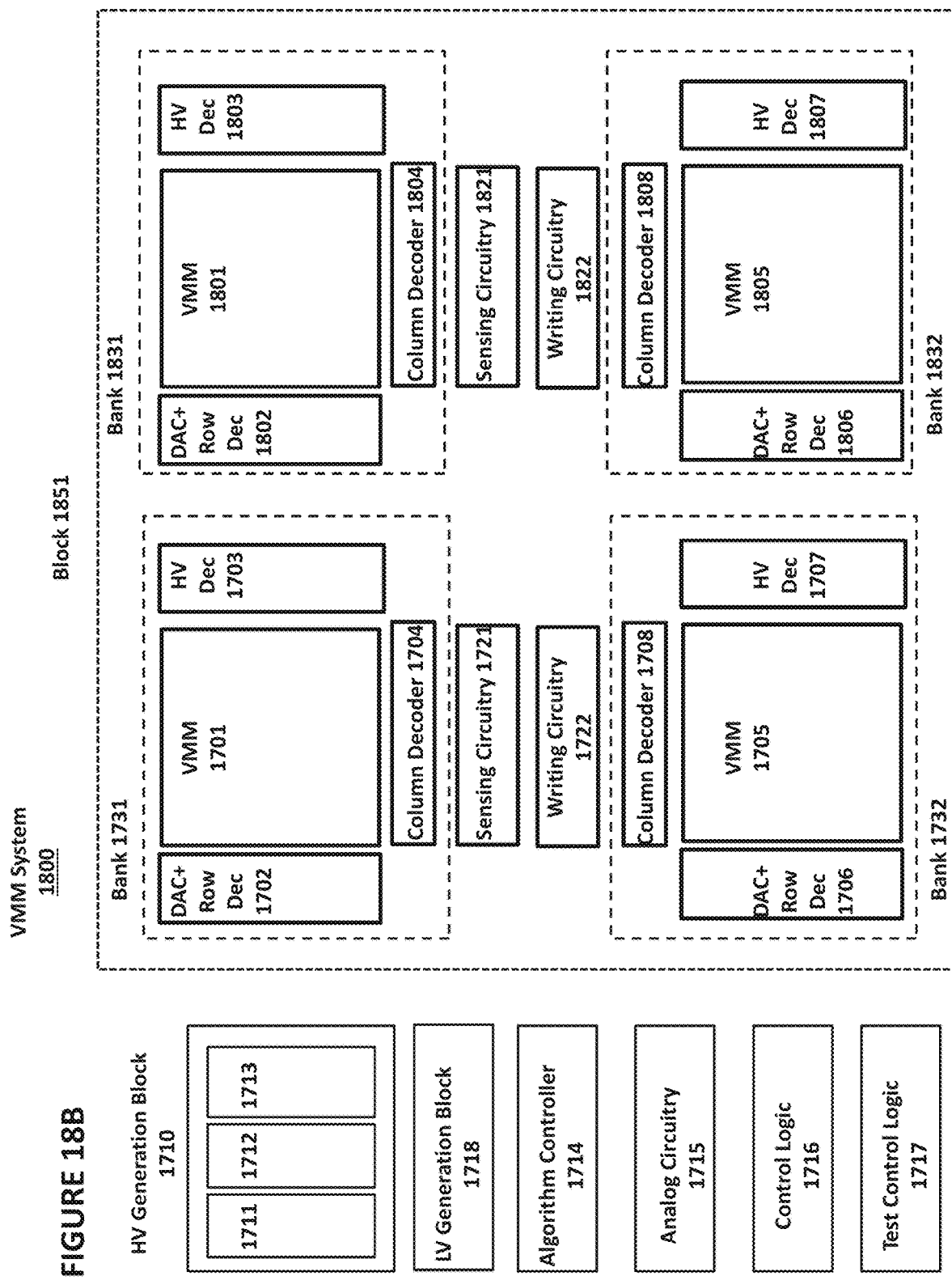

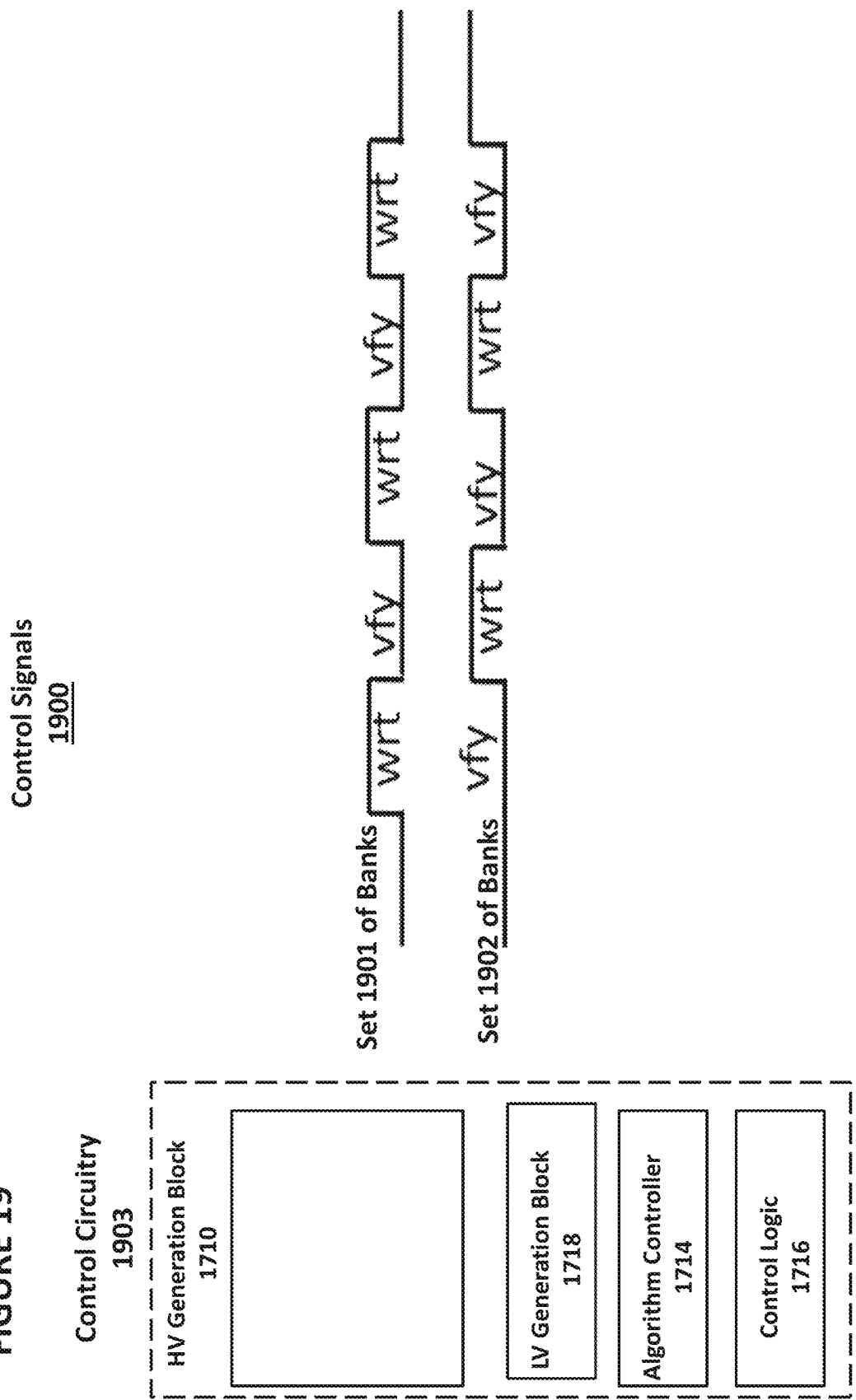

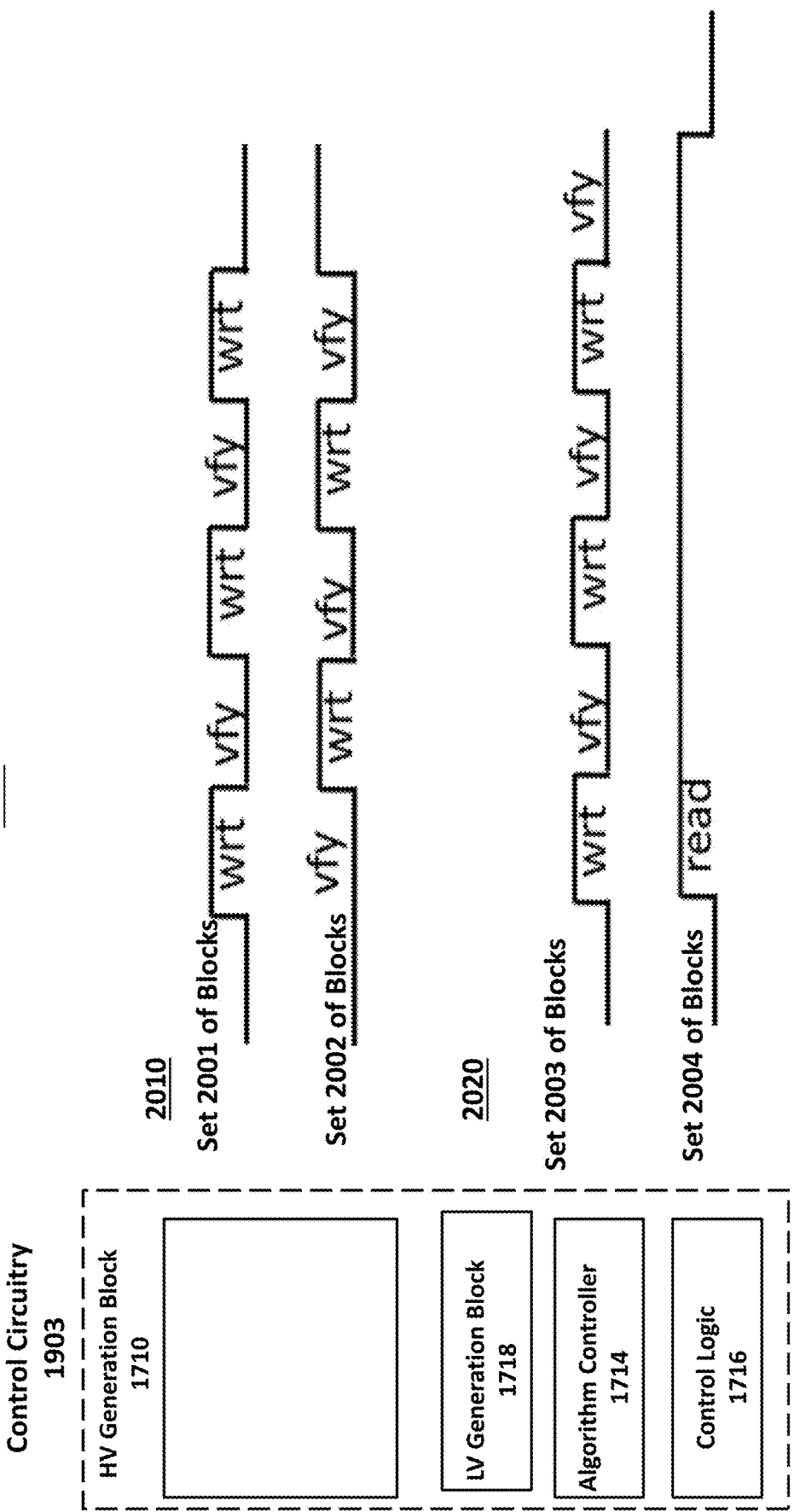

CONCURRENT WRITE AND VERIFY OPERATIONS IN AN ANALOG NEURAL MEMORY

This application claims priority to U.S. Provisional Patent Application No. 63/070,051, filed on Aug. 25, 2020, and titled, "Concurrent Write and Verify Operations in An Analog Neural Memory," which is incorporated by reference herein.

FIELD OF THE INVENTION

Numerous embodiments of analog neural memory arrays and associated circuitry that enable concurrent write and verify operations are disclosed.

BACKGROUND OF THE INVENTION

Artificial neural networks mimic biological neural networks (the central nervous systems of animals, in particular the brain) and are used to estimate or approximate functions that can depend on a large number of inputs and are generally unknown. Artificial neural networks generally include layers of interconnected "neurons" which exchange messages between each other.

FIG. 1 illustrates an artificial neural network, where the circles represent the inputs or layers of neurons. The connections (called synapses) are represented by arrows, and have numeric weights that can be tuned based on experience. This makes the artificial neural network adaptive to inputs and capable of learning. Typically, artificial neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical artificial neural networks rely on a very large number of synapses, enabling high connectivity between neurons, i.e. a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

Applicant previously disclosed an artificial (analog) neural network that utilizes one or more non-volatile memory arrays as the synapses in U.S. patent application Ser. No. 15/594,439, published as US Patent Publication 2017/0337466, which is incorporated by reference. The non-volatile memory arrays operate as an analog neuromorphic memory. The term neuromorphic, as used herein, means circuitry that implement models of neural systems. The analog neuromorphic memory includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells is configured to store a weight value corresponding to a number of electrons on the floating gate. The plurality of memory cells is configured to multiply the first plurality of inputs by the stored weight values to generate the first plurality of outputs. An array of memory cells arranged in this manner can be referred to as a vector by matrix multiplication (VMM) array. Optionally, the memory cells are non-volatile memory cells.

Examples of different non-volatile memory cells that can be used in VMMs will now be discussed.

Non-Volatile Memory Cells

Various types of known non-volatile memory cells can be used in the VMM arrays. For example, U.S. Pat. No. 5,029,130 ("the '130 patent"), which is incorporated herein by reference, discloses an array of split gate non-volatile memory cells, which are a type of flash memory cells. Such a memory cell 210 is shown in FIG. 2. Each memory cell 210 includes source region 14 and drain region 16 formed in semiconductor substrate 12, with channel region 18 there between. Floating gate 20 is formed over and insulated from (and controls the conductivity of) a first portion of the channel region 18, and over a portion of the source region 14. Word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline terminal 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim tunneling.

Memory cell 210 is programmed (where electrons are placed on the floating gate) by placing a positive voltage on the word line terminal 22, and a positive voltage on the source region 14. Electron current will flow from the drain region 16 towards the source region 14 (source line terminal). The electrons will accelerate and become energized (heated) when they reach the gap between the word line terminal 22 and the floating gate 20. Some of the heated electrons will be injected through the gate oxide onto the floating gate 20 due to the attractive electrostatic force from the floating gate 20.

Memory cell 210 is read by placing positive read voltages on the drain region 16 and word line terminal 22 (which turns on the portion of the channel region 18 under the word line terminal). If the floating gate 20 is positively charged (i.e. erased of electrons), then the portion of the channel region 18 under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage ranges that can be applied to the terminals of memory cell 110 for performing read, erase, and program operations:

TABLE NO. 1

Operation of Flash Memory Cell 210 of FIG. 2

|        | WL      | BL      | SL     |
|--------|---------|---------|--------|
| Read 1 | 0.5-3 V | 0.1-2 V | 0 V    |
| Read 2 | 0.5-3 V | 0-2 V   | 2-0.1 V|
| Erase  | ~11-13 V| 0 V     | 0 V    |
| Program| 1-2 V   | 1-3 μA  | 9-10 V |

"Read 1" is a read mode in which the cell current is output on the bit line. "Read 2" is a read mode in which the cell current is output on the source line terminal.

FIG. 3 shows memory cell 310, which is similar to memory cell 210 of FIG. 2 with the addition of control gate (CG) terminal 28. Control gate terminal 28 is biased at a high voltage, e.g., 10V, in programming, low or negative in erase, e.g., 0v/−8V, low or mid range in read, e.g., 0v/2.5V. Other terminals are biased similarly to that of FIG. 2.

FIG. 4 depicts four-gate memory cell 410 comprising source region 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. This configuration is described in U.S. Pat. No. 6,747,310, which is incorporated herein by reference for all purposes. Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 2 depicts typical voltage ranges that can be applied to the terminals of memory cell 410 for performing read, erase, and program operations:

TABLE NO. 2

Operation of Flash Memory Cell 410 of FIG. 4

|        | WL/SG    | BL      | CG      | EG      | SL      |
|--------|----------|---------|---------|---------|---------|
| Read 1 | 0.5-2 V  | 0.1-2 V | 0-2.6 V | 0-2.6 V | 0 V     |
| Read 2 | 0.5-2 V  | 0-2 V   | 0-2.6 V | 0-2.6 V | 2-0.1 V |
| Erase  | −0.5 V/0 V| 0 V    | 0 V/−8 V| 8-12 V  | 0 V     |
| Program| 1 V      | 1 μA    | 8-11 V  | 4.5-9 V | 4.5-5 V |

"Read 1" is a read mode in which the cell current is output on the bit line. "Read 2" is a read mode in which the cell current is output on the source line terminal.

FIG. 5 shows memory cell 510, which is similar to memory cell 410 of FIG. 4 except that memory cell 510 does not contain an erase gate EG terminal. An erase is performed by biasing the substrate 18 to a high voltage and biasing the control gate CG terminal 28 to a low or negative voltage. Alternatively, an erase is performed by biasing word line terminal 22 to a positive voltage and biasing control gate terminal 28 to a negative voltage. Programming and reading is similar to that of FIG. 4.

FIG. 6 depicts a three-gate memory cell 610, which is another type of flash memory cell. Memory cell 610 is identical to the memory cell 410 of FIG. 4 except that memory cell 610 does not have a separate control gate terminal. The erase operation (whereby erasing occurs through use of the erase gate terminal) and read operation are similar to that of the FIG. 4 except there is no control gate bias applied. The programming operation also is done without the control gate bias, and as a result, a higher voltage must be applied on the source line terminal during a program operation to compensate for a lack of control gate bias.

Table No. 3 depicts typical voltage ranges that can be applied to the terminals of memory cell 610 for performing read, erase, and program operations:

TABLE NO. 3

Operation of Flash Memory Cell 610 of FIG. 6

|        | WL/SG    | BL      | EG      | SL      |
|--------|----------|---------|---------|---------|
| Read 1 | 0.5-2.2 V| 0.1-2 V | 0-2.6 V | 0 V     |
| Read 2 | 0.5-2.2 V| 0-2 V   | 0-2.6 V | 2-0.1 V |
| Erase  | −0.5 V/0 V| 0 V    | 11.5 V  | 0 V     |
| Program| 1 V      | 2-3 μA  | 4.5 V   | 7-9 V   |

"Read 1" is a read mode in which the cell current is output on the bit line. "Read 2" is a read mode in which the cell current is output on the source line terminal.

FIG. 7 depicts stacked gate memory cell 710, which is another type of flash memory cell. Memory cell 710 is similar to memory cell 210 of FIG. 2, except that floating gate 20 extends over the entire channel region 18, and control gate terminal 22 (which here will be coupled to a word line) extends over floating gate 20, separated by an insulating layer (not shown). Programming is performed using hot electron injection from channel 18 to floating gate 20 in the channel region next to the drain region 16, and erasing is performed using by Fowler-Nordheim electron tunneling from floating gate 20 to substrate 12. The read operations operate in a similar manner to that described previously for memory cell 210.

Table No. 4 depicts typical voltage ranges that can be applied to the terminals of memory cell 710 and substrate 12 for performing read, erase, and program operations:

TABLE NO. 4

Operation of Flash Memory Cell 710 of FIG. 7

|        | CG           | BL        | SL        | Substrate |
|--------|--------------|-----------|-----------|-----------|
| Read 1 | 0-5 V        | 0.1-2 V   | 0-2 V     | 0 V       |
| Read 2 | 0.5-2 V      | 0-2 V     | 2-0.1 V   | 0 V       |
| Erase  | −8 to −10 V/0 V | FLT    | FLT       | 8-10 V/15-20 V |
| Program| 8-12 V       | 3-5 V/0 V | 0 V/3-5 V | 0 V       |

"Read 1" is a read mode in which the cell current is output on the bit line. "Read 2" is a read mode in which the cell current is output on the source line terminal. Optionally, in arrays comprising rows and columns of memory cells 210, 310, 410, 510, 610, or 710, source lines can be coupled to one row of memory cells or to two adjacent rows of memory cells. That is, source line terminals can be shared by adjacent rows of memory cells.

FIG. 8 depicts twin split-gate memory cell 810. Twin split-gate memory cell 810 comprises floating gate (FG) 20 disposed over and insulated from the substrate 12, a control gate 28 (CG) disposed over and insulated from the floating gate 20, an erase gate 30 (EG) disposed adjacent to and insulated from the floating and control gates 20/28 and disposed over and insulated from the substrate 12, where the erase gate 30 is created with a T shape such that a top corner of the control gate 28 faces the inside corner of the T shaped erase gate 30 to improve erase efficiency, and a drain region 16 (DR) in the substrate 12 adjacent the floating gate 20 (with a bit line contact 24 (BL) connected to the drain diffusion regions 16 (DR)). The memory cells are formed as pairs of memory cells (A on the left and B on the right), sharing a common erase gate 30. This cell design differs from the memory cells discussed above with reference to FIGS. 2-7 at least in that it lacks a source region under the erase gate 30, lacks a select gate (also referred to as a word line), and lacks a channel region for each memory cell. Instead, a single continuous channel region 18 extends under both memory cells (i.e. extends from the drain region 16 of one memory cell to the drain region 16 of the other memory cell). To read or program one memory cell, the control gate 28 of the other memory cell is raised to a sufficient voltage to turn on the underlying channel region portion via voltage coupling to the floating gate 20 there between (e.g. to read or program cell A, the voltage on FGB is raised via voltage coupling from CGB to turn on the channel region portion under FGB). Erasing is performed using Fowler Nordheim electron tunneling from floating gate 20 to erase gate 30. Programming is performed using hot electron injection from channel region 18 to floating gate 20, this is indicated as PROGRAM 1 in Table 5. Alternatively, programming is performed using Fowler Nordheim electron tunneling from erase gate 30 to floating gate 20, this is indicated as PROGRAM 2 in Table 5. Alternatively programming is performed using Fowler Nordheim electron tunneling from channel region 18 to floating gate 20, in this case the condition is similar to PROGRAM 2 except that the substrate 12 is biased at a low voltage or negative voltage while erase gate 30 is biased at a low positive voltage.

Table No. 5 depicts typical voltage ranges that can be applied to the terminals of twin split-gate memory cell 810 for performing read, erase, and program operations:

TABLE NO. 5

Operation of Flash Memory Cell 810 of FIG. 8

| | CGA | BLA | EG | CGB | BLB |
|---|---|---|---|---|---|
| READ | 1.5-4 V | 0.1-0.8 V | 2.5 V | 1.5-4 V | 0 |
| ERASE | 0 V to −8 V | 0 V | 8 V to 11.5 V | 0 V to 4 V (Vcginhe) | 0 V |
| PROGRAM 1 | 10.5 V | 4.5 V | 1.5 V | 4 | Iprog |
| PROGRAM 2 | 4 V to 11.5 V | 0 V | −4 V to −11.5 V | 0 V to −2 V (Vcginhp) | 0 V |

In order to utilize the memory arrays comprising one of the types of non-volatile memory cells described above in an artificial neural network, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e. charge on the floating gate) of each memory cell in the array can be continuously changed from a fully erased state to a fully programmed state, independently and with minimal disturbance of other memory cells. In another embodiment, the memory state (i.e., charge on the floating gate) of each memory cell in the array can be continuously changed from a fully programmed state to a fully erased state, and vice-versa, independently and with minimal disturbance of other memory cells. This means the cell storage is analog or at the very least can store one of many discrete values (such as 16 or 64 different values), which allows for very precise and individual tuning of all the cells in the memory array, and which makes the memory array ideal for storing and making fine tuning adjustments to the synapsis weights of the neural network.

The methods and means described herein may apply to other non-volatile memory technologies such as FINFET split gate flash or stack gate flash memory, NAND flash, SONOS (silicon-oxide-nitride-oxide-silicon, charge trap in nitride), MONOS (metal-oxide-nitride-oxide-silicon, metal charge trap in nitride), ReRAM (resistive ram), PCM (phase change memory), MRAM (magnetic ram), FeRAM (ferroelectric ram), OTP (bi-level or multi-level one time programmable), and CeRAM (correlated electron ram), without limitation. The methods and means described herein may apply to volatile memory technologies used for neural network such as SRAM, DRAM, and other volatile synapse cells, without limitation.

Neural Networks Employing Non-Volatile Memory Cell Arrays

FIG. 9 conceptually illustrates a non-limiting example of a neural network utilizing a non-volatile memory array of the present embodiments. This example uses the non-volatile memory array neural network for a facial recognition application, but any other appropriate application could be implemented using a non-volatile memory array based neural network.

S0 is the input layer, which for this example is a 32×32 pixel RGB image with 5 bit precision (i.e. three 32×32 pixel arrays, one for each color R, G and B, each pixel being 5 bit precision). The synapses CB1 going from input layer S0 to layer C1 apply different sets of weights in some instances and shared weights in other instances, and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, where these 9 input values are multiplied by the appropriate weights and, after summing the outputs of that multiplication, a single output value is determined and provided by a first synapse of CB1 for generating a pixel of one of the feature maps of layer C1. The 3×3 filter is then shifted one pixel to the right within input layer S0 (i.e., adding the column of three pixels on the right, and dropping the column of three pixels on the left), whereby the 9 pixel values in this newly positioned filter are provided to the synapses CB1, where they are multiplied by the same weights and a second single output value is determined by the associated synapse. This process is continued until the 3×3 filter scans across the entire 32×32 pixel image of input layer S0, for all three colors and for all bits (precision values). The process is then repeated using different sets of weights to generate a different feature map of layer C1, until all the features maps of layer C1 have been calculated.

In layer C1, in the present example, there are 16 feature maps, with 30×30 pixels each. Each pixel is a new feature pixel extracted from multiplying the inputs and kernel, and therefore each feature map is a two dimensional array, and thus in this example layer C1 constitutes 16 layers of two dimensional arrays (keeping in mind that the layers and arrays referenced herein are logical relationships, not necessarily physical relationships—i.e., the arrays are not necessarily oriented in physical two dimensional arrays). Each of the 16 feature maps in layer C1 is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from layer C1 to layer S1, which pools values from consecutive, non-overlapping 2×2 regions in each feature map. The purpose of the pooling function P1 is to average out the nearby location (or a max function can also be used), to reduce the dependence of the edge location for example and to reduce the data size before going to the next stage. At layer S1, there are 16 15×15 feature maps (i.e., sixteen different arrays of 15×15 pixels each). The synapses CB2 going from layer S1 to layer C2 scan maps in layer S1 with 4×4 filters, with a filter shift of 1 pixel. At layer C2, there are 22 12×12 feature maps. An activation function P2 (pooling) is applied before going from layer C2 to layer S2, which pools values from consecutive non-overlapping 2×2 regions in each feature map. At layer S2, there are 22 6×6 feature maps. An activation function (pooling) is applied at the synapses CB3 going from layer S2 to layer C3, where every neuron in layer C3 connects to every map in layer S2 via a respective synapse of CB3. At layer C3, there are 64 neurons. The synapses CB4 going from layer C3 to the output layer S3 fully connects C3 to S3, i.e. every neuron in layer C3 is connected to every neuron in layer S3. The output at S3 includes 10 neurons, where the highest output neuron determines the class. This output could, for example, be indicative of an identification or classification of the contents of the original image.

Each layer of synapses is implemented using an array, or a portion of an array, of non-volatile memory cells.

FIG. 10 is a block diagram of a system that can be used for that purpose. VMM system 32 includes non-volatile memory cells and is utilized as the synapses (such as CB1, CB2, CB3, and CB4 in FIG. 6) between one layer and the next layer. Specifically, VMM system 32 comprises VMM array 33 comprising non-volatile memory cells arranged in rows and columns, erase gate and word line gate decoder 34, control gate decoder 35, bit line decoder 36 and source line decoder 37, which decode the respective inputs for the non-volatile memory cell array 33. Input to VMM array 33 can be from the erase gate and wordline gate decoder 34 or from the control gate decoder 35. Source line decoder 37 in this example also decodes the output of VMM array 33. Alternatively, bit line decoder 36 can decode the output of VMM array 33.

VMM array 33 serves two purposes. First, it stores the weights that will be used by the VMM system 32. Second, VMM array 33 effectively multiplies the inputs by the weights stored in VMM array 33 and adds them up per output line (source line or bit line) to produce the output, which will be the input to the next layer or input to the final layer. By performing the multiplication and addition function, VMM array 33 negates the need for separate multiplication and addition logic circuits and is also power efficient due to its in-situ memory computation.

The output of VMM array 33 is supplied to a differential summer (such as a summing op-amp or a summing current mirror) 38, which sums up the outputs of VMM array 33 to create a single value for that convolution. The differential summer 38 is arranged to perform summation of both positive weight and negative weight inputs to output the single value.

The summed up output values of differential summer 38 are then supplied to an activation function circuit 39, which rectifies the output. The activation function circuit 39 may provide sigmoid, tanh, ReLU functions, or any other non-linear function. The rectified output values of activation function circuit 39 become an element of a feature map of the next layer (e.g. C1 in FIG. 9), and are then applied to the next synapse to produce the next feature map layer or final layer. Therefore, in this example, VMM array 33 constitutes a plurality of synapses (which receive their inputs from the prior layer of neurons or from an input layer such as an image database), and summer 38 and activation function circuit 39 constitute a plurality of neurons.

The input to VMM system 32 in FIG. 10 (WLx, EGx, CGx, and optionally BLx and SLx) can be analog level, binary level, digital pulses (in which case a pulses-to-analog converter PAC may be needed to convert pulses to the appropriate input analog level) or digital bits (in which case a DAC is provided to convert digital bits to appropriate input analog level) and the output can be analog level (e.g., current, voltage, or charge), binary level, digital pulses, or digital bits (in which case an output ADC is provided to convert output analog level into digital bits).

FIG. 11 is a block diagram depicting the usage of numerous layers of VMM systems 32, here labeled as VMM systems 32a, 32b, 32c, 32d, and 32e. As shown in FIG. 11, the input, denoted Inputx, is converted from digital to analog by a digital-to-analog converter 31, and provided to input VMM system 32a. The converted analog inputs could be voltage or current. The input D/A conversion for the first layer could be done by using a function or a LUT (look up table) that maps the inputs Inputx to appropriate analog levels for the matrix multiplier of input VMM system 32a. The input conversion could also be done by an analog to analog (A/A) converter to convert an external analog input to a mapped analog input to the input VMM system 32a. The input conversion could also be done by a digital-to-digital pules (D/P) converter to convert an external digital input to a mapped digital pulse or pulses to the input VMM system 32a.

The output generated by input VMM system 32a is provided as an input to the next VMM system (hidden level 1) 32b, which in turn generates an output that is provided as an input to the next VMM system (hidden level 2) 32c, and so on. The various layers of VMM system 32 function as different layers of synapses and neurons of a convolutional neural network (CNN). Each VMM system 32a, 32b, 32c, 32d, and 32e can be a stand-alone, physical system comprising a respective non-volatile memory array, or multiple VMM systems could utilize different portions of the same physical non-volatile memory array, or multiple VMM systems could utilize overlapping portions of the same physical non-volatile memory array. Each VMM system 32a, 32b, 32c, 32d, and 32e can also be time multiplexed for various portion of its array or neurons. The example shown in FIG. 11 contains five layers (32a,32b,32c,32d,32e): one input layer (32a), two hidden layers (32b,32c), and two fully connected layers (32d,32e). One of ordinary skill in the art will appreciate that this is merely exemplary and that a system instead could comprise more than two hidden layers and more than two fully connected layers.

VMM Arrays

FIG. 12 depicts neuron VMM array 1200, which is particularly suited for memory cells 310 as shown in FIG. 3, and is utilized as the synapses and parts of neurons between an input layer and the next layer. VMM array 1200 comprises memory array 1201 of non-volatile memory cells and reference array 1202 (at the top of the array) of non-volatile reference memory cells. Alternatively, another reference array can be placed at the bottom.

In VMM array 1200, control gate lines, such as control gate line 1203, run in a vertical direction (hence reference array 1202 in the row direction is orthogonal to control gate line 1203), and erase gate lines, such as erase gate line 1204, run in a horizontal direction. Here, the inputs to VMM array 1200 are provided on the control gate lines (CG0, CG1, CG2, CG3), and the output of VMM array 1200 emerges on the source lines (SL0, SL1). In one embodiment, only even rows are used, and in another embodiment, only odd rows are used. The current placed on each source line (SL0, SL1, respectively) performs a summing function of all the currents from the memory cells connected to that particular source line.

As described herein for neural networks, the non-volatile memory cells of VMM array 1200, i.e. the memory cells 310 of VMM array 1200, are preferably configured to operate in a sub-threshold region.

The non-volatile reference memory cells and the non-volatile memory cells described herein are biased in weak inversion:

$$Ids = Io * e^{(Vg-Vth)/nVt} = w * Io * e^{(Vg)/nVt},$$

where $w = e^{(-Vth)/nVt}$ where Ids is the drain to source current; Vg is gate voltage on the memory cell; Vth is threshold voltage of the memory cell; Vt is thermal voltage=k*T/q with k being the Boltzmann constant, T the temperature in Kelvin, and q the electronic charge; n is a slope factor=1+(Cdep/Cox) with Cdep=capacitance of the depletion layer, and Cox capacitance of the gate oxide layer; Io is the memory cell current at gate voltage equal to threshold voltage, Io is proportional to (Wt/L)*u*Cox*(n−1)*Vt² where u is carrier mobility and Wt and L are width and length, respectively, of the memory cell.

For an I-to-V log converter using a memory cell (such as a reference memory cell or a peripheral memory cell) or a transistor to convert input current Ids, into an input voltage, Vg:

$$Vg = n*Vt*\log[Ids/wp*Io]$$

Here, wp is w of a reference or peripheral memory cell.

For an I-to-V log converter using a memory cell (such as a reference memory cell or a peripheral memory cell) or a transistor to convert input current Ids, into an input voltage, Vg:

$$Vg = n*Vt*\log[Ids/wp*Io]$$

where, wp is w of a reference or peripheral memory cell.

For a memory array used as a vector matrix multiplier VMM array, the output current is:

$$Iout = wa*Io*e^{(Vg)/nVt}, \text{ namely}$$

$$Iout = (wa/wp)*Iin = W*Iin$$

$$W = e^{(Vthp-Vtha)/nVt}$$

$$Iin = wp*Io*e^{(Vg)/nVt}$$

Here, wa=w of each memory cell in the memory array.

A wordline or control gate can be used as the input for the memory cell for the input voltage.

Alternatively, the non-volatile memory cells of VMM arrays described herein can be configured to operate in the linear region:

$$Ids = beta*(Vgs-Vth)*Vds; beta=u*Cox*Wt/L,$$

$$W\alpha(Vgs-Vth),$$

meaning weight W in the linear region is proportional to (Vgs−Vth)

A wordline or control gate or bitline or sourceline can be used as the input for the memory cell operated in the linear region. The bitline or sourceline can be used as the output for the memory cell.

For an I-to-V linear converter, a memory cell (such as a reference memory cell or a peripheral memory cell) or a transistor operating in the linear region or a resistor can be used to linearly convert an input/output current into an input/output voltage.

Alternatively, the memory cells of VMM arrays described herein can be configured to operate in the saturation region:

$$Ids = \frac{1}{2}*beta*(Vgs-Vth)^2; beta=u*Cox*Wt/L$$

$$W\alpha(Vgs-Vth)^2, \text{ meaning weight } W \text{ is proportional to } (Vgs-Vth)^2$$

A wordline, control gate, or erase gate can be used as the input for the memory cell operated in the saturation region. The bitline or sourceline can be used as the output for the output neuron.

Alternatively, the memory cells of VMM arrays described herein can be used in all regions or a combination thereof (sub threshold, linear, or saturation) for each layer or multi layers of a neural network.

FIG. 13 depicts neuron VMM array 1300, which is particularly suited for memory cells 210 as shown in FIG. 2, and is utilized as the synapses between an input layer and the next layer. VMM array 1300 comprises a memory array 1303 of non-volatile memory cells, reference array 1301 of first non-volatile reference memory cells, and reference array 1302 of second non-volatile reference memory cells. Reference arrays 1301 and 1302, arranged in the column direction of the array, serve to convert current inputs flowing into terminals BLR0, BLR1, BLR2, and BLR3 into voltage inputs WL0, WL1, WL2, and WL3. In effect, the first and second non-volatile reference memory cells are diode-connected through multiplexors 1314 (only partially depicted) with current inputs flowing into them. The reference cells are tuned (e.g., programmed) to target reference levels. The target reference levels are provided by a reference mini-array matrix (not shown).

Memory array 1303 serves two purposes. First, it stores the weights that will be used by the VMM array 1300 on respective memory cells thereof. Second, memory array 1303 effectively multiplies the inputs (i.e. current inputs provided in terminals BLR0, BLR1, BLR2, and BLR3, which reference arrays 1301 and 1302 convert into the input voltages to supply to wordlines WL0, WL1, WL2, and WL3) by the weights stored in the memory array 1303 and then adds all the results (memory cell currents) to produce the output on the respective bit lines (BL0-BLN), which will be the input to the next layer or input to the final layer. By performing the multiplication and addition function, memory array 1303 negates the need for separate multiplication and addition logic circuits and is also power efficient. Here, the voltage inputs are provided on the word lines WL0, WL1, WL2, and WL3, and the output emerges on the respective bit lines BL0-BLN during a read (inference) operation. The current placed on each of the bit lines BL0-BLN performs a summing function of the currents from all non-volatile memory cells connected to that particular bitline.

Table No. 6 depicts operating voltages for VMM array 1300. The columns in the table indicate the voltages placed on word lines for selected cells, word lines for unselected cells, bit lines for selected cells, bit lines for unselected cells, source lines for selected cells, and source lines for unselected cells, where FLT indicates floating, i.e. no voltage is imposed. The rows indicate the operations of read, erase, and program.

CG2, and CG3. In effect, the first and second non-volatile reference memory cells are diode-connected through multiplexors 1512 (only partially shown) with current inputs flowing into them through BLR0, BLR1, BLR2, and BLR3. Multiplexors 1512 each include a respective multiplexor 1505 and a cascoding transistor 1504 to ensure a constant voltage on the bitline (such as BLR0) of each of the first and second non-volatile reference memory cells during a read operation. The reference cells are tuned to target reference levels.

TABLE No 6

Operation of VMM Array 1300 of FIG. 13:

|  | WL | WL-unsel | BL | BL-unsel | SL | SL-unsel |
|---|---|---|---|---|---|---|
| Read | 0.5-3.5 V | −0.5 V/0 V | 0.1-2 V (Ineuron) | 0.6 V-2 V/FLT | 0 V | 0 V |
| Erase | ~5-13 V | 0 V | 0 V | 0 V | 0 V | 0 V |
| Program | 1-2 V | −0.5 V/0 V | 0.1-3 uA | Vinh ~2.5V | 4-10V | 0-1V/FLT |

FIG. 14 depicts neuron VMM array 1400, which is particularly suited for memory cells 210 as shown in FIG. 2, and is utilized as the synapses and parts of neurons between an input layer and the next layer. VMM array 1400 comprises a memory array 1403 of non-volatile memory cells, reference array 1401 of first non-volatile reference memory cells, and reference array 1402 of second non-volatile reference memory cells. Reference arrays 1401 and 1402 run in row direction of the VMM array 1400. VMM array is similar to VMM 1300 except that in VMM array 1400, the word lines run in the vertical direction. Here, the inputs are provided on the word lines (WLA0, WLB0, WLA1, WLB2, WLA2, WLB2, WLA3, WLB3), and the output emerges on the source line (SL0, SL1) during a read operation. The current placed on each source line performs a summing function of all the currents from the memory cells connected to that particular source line.

Table No. 7 depicts operating voltages for VMM array 1400. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE No 7

Operation of VMM Array 1400 of FIG. 14

|  | WL | WL-unsel | BL | BL-unsel | SL | SL-unsel |
|---|---|---|---|---|---|---|
| Read | 0.5-3.5 V | −0.5 V/0 V | 0.1-2 V | 0.1 V-2 V/FLT | ~0.3-1 V (Ineuron) | 0 V |
| Erase | ~5-13 V | 0 V | 0 V | 0 V | 0 V | SL-inhibit (~4-8 V) |
| Program | 1-2 V | −0.5 V/0 V | 0.1-3 uA | Vinh ~2.5 V | 4-10 V | 0-1 V/FLT |

FIG. 15 depicts neuron VMM array 1500, which is particularly suited for memory cells 310 as shown in FIG. 3, and is utilized as the synapses and parts of neurons between an input layer and the next layer. VMM array 1500 comprises a memory array 1503 of non-volatile memory cells, reference array 1501 of first non-volatile reference memory cells, and reference array 1502 of second non-volatile reference memory cells. Reference arrays 1501 and 1502 serve to convert current inputs flowing into terminals BLR0, BLR1, BLR2, and BLR3 into voltage inputs CG0, CG1, Memory array 1503 serves two purposes. First, it stores the weights that will be used by the VMM array 1500. Second, memory array 1503 effectively multiplies the inputs (current inputs provided to terminals BLR0, BLR1, BLR2, and BLR3, for which reference arrays 1501 and 1502 convert these current inputs into the input voltages to supply to the control gates (CG0, CG1, CG2, and CG3) by the weights stored in the memory array and then add all the results (cell currents) to produce the output, which appears on BL0-BLN, and will be the input to the next layer or input to the final layer. By performing the multiplication and addition function, the memory array negates the need for separate multiplication and addition logic circuits and is also power efficient. Here, the inputs are provided on the control gate lines (CG0, CG1, CG2, and CG3), and the output emerges on the bitlines (BL0-BLN) during a read operation. The current placed on each bitline performs a summing function of all the currents from the memory cells connected to that particular bitline.

VMM array 1500 implements uni-directional tuning for non-volatile memory cells in memory array 1503. That is, each non-volatile memory cell is erased and then partially programmed until the desired charge on the floating gate is reached. If too much charge is placed on the floating gate (such that the wrong value is stored in the cell), the cell is erased and the sequence of partial programming operations starts over. As shown, two rows sharing the same erase gate (such as EG0 or EG1) are erased together (which is known as a page erase), and thereafter, each cell is partially programmed until the desired charge on the floating gate is reached.

Table No. 8 depicts operating voltages for VMM array 1500. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

reference cells through multiplexors 1614) to be applied to the memory cells in the row direction. The current output (neuron) is in the bitlines BL0-BLN, where each bit line sums all currents from the non-volatile memory cells connected to that particular bitline.

Table No. 9 depicts operating voltages for VMM array 1600. The columns in the table indicate the voltages placed TABLE No 8

Operation of VMM Array 1500 of FIG. 15

| | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 0.5-2 V | −0.5 V/0 V | 0.1-2 V (Ineuron) | 0 V/FLT | 0-2.6 V | 0-2.6 V | 0-2.6 V | 0-2.6 V | 0-2.6 V | 0 V | 0 V |
| Erase | 0 V | 0 V | 0 V | 0 V | 0 V | 0-2.6 V | 0-2.6 V | 5-12 V | 0-2.6 V | 0 V | 0 V |
| Program | 0.7-1 V | −0.5 V/0 V | 0.1-1 uA | Vinh (1-2V) | 4-11 V | 0-2.6 V | 0-2.6 V | 4.5-5 V | 0-2.6 V | 4.5-5 V | 0-1 V |

FIG. 16 depicts neuron VMM array 1600, which is particularly suited for memory cells 310 as shown in FIG. 3, and is utilized as the synapses and parts of neurons between an input layer and the next layer. VMM array 1600 comprises a memory array 1603 of non-volatile memory cells, reference array 1601 or first non-volatile reference memory cells, and reference array 1602 of second non-volatile reference memory cells. EG lines EGR0, EG0, EG1 and EGR1 are run vertically while CG lines CG0, CG1, CG2 and CG3 and SL lines WL0, WL1, WL2 and WL3 are run horizontally. VMM array 1600 is similar to VMM array 1600, except that VMM array 1600 implements bi-directional tuning, where each individual cell can be completely erased, partially programmed, and partially erased as needed to reach the desired amount of charge on the floating gate due to the use of separate EG lines. As shown, reference arrays 1601 and 1602 convert input current in the terminal BLR0, BLR1, BLR2, and BLR3 into control gate voltages CG0, CG1, CG2, and CG3 (through the action of diode-connected on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE No 9

Operation of VMM Array 1600 of FIG. 16

| | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2 V | −0.5 V/0 V | 0.6-2 V (Ineuron) | 0 V/FLT | 0-2.6 V | 0-2.6 V | 0-2.6 V | 0-2.6 V | 0-2.6 V | 0 V | 0 V/FLT |
| Erase | 0 V | 0 V | 0 V | 0 V | 0 V | 4-9 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

The input to the VMM arrays can be an analog level, a binary level, timing pulses, or digital bits and the output can be an analog level, a binary level, timing pulses, or digital bits (in this case an output ADC is needed to convert output analog level current or voltage into digital bits).

For each memory cell in a VMM array, each weight W can be implemented by a single memory cell or by a differential cell or by two blend memory cells (average of 2 or more cells). In the differential cell case, two memory cells are needed to implement a weight W as a differential weight (W=W+−W−). In the two blend memory cells, two memory cells are needed to implement a weight W as an average of two cells.

One challenge with prior art VMM systems is that storing the desired analog value in a cell—which comprises one or more sequences of write and verify operations—can take a relatively large amount of time, since much greater precision is required than in a traditional memory array where only two possible values (i.e., 1 and 0) can be stored. Here, a write operation comprises an erase operation, a program operation, or both and erase operation and a program operation, and a verify operation is a read operation to confirm that the write operation was correctly performed.

What is needed is an improved VMM system that has a reduced timing overhead for storing the desired analog value in a selected non-volatile memory cell. Furthermore, it is desirable to have a VMM system that can write memory cells in a VMM array (for example, to perform weight updates in a neural network) while concurrently reading other memory cells in the VMM array (for example, to perform a verify operation during a weight tuning operation or to perform inference for a neural network).

SUMMARY OF THE INVENTION

Numerous embodiments of VMM systems circuitry that enable concurrent write and verify or read operations are disclosed. A "write" refers to an operation that changes the weight stored in a memory cell such as by programming the cell and/or erasing the cell. A "verify" refers to an operation that senses an output (such as cell current) of a memory cell and confirms that it has reached a target. A "read" refers to an operation that senses an output of the memory cell. In some embodiments, concurrent write and verify or read operations occur among different banks of memory. In other embodiments, concurrent write and verify or read operations occur among different blocks of memory, where each block comprises two or more banks of memory. The embodiments substantially reduce the timing overhead for weight writing and verifying or reading operations in a VMM array. In one embodiment, an analog neural memory system comprises a first bank comprising a first array of non-volatile memory cells, a second bank comprising a second array of non-volatile memory cells, writing circuitry shared by the first bank and the second bank, sensing circuitry shared by the first bank and the second bank, and control circuitry for concurrently performing a write operation using the writing circuitry on one of the first bank and the second bank and a verify operation using the sensing circuitry on the other of the first bank and the second bank.

In another embodiment, a method of performing concurrent write and verify operations in an analog neural memory comprising a first bank comprising a first array of non-volatile memory cells and a second bank comprising a second array of non-volatile memory cells is disclosed, the method comprising concurrently performing a write operation on one of the first bank and the second bank and a verify operation on the other of the first bank and the second bank.

In another embodiment, an analog neural memory system comprise a first block comprising two or more banks of non-volatile memory cells, each bank comprising an array of non-volatile memory cells, a second block comprising two or more banks of non-volatile memory cells, each bank comprising an array of non-volatile memory cells, and control circuitry for concurrently performing a write operation on one of the first block and the second block and performing a verify operation on the other of the first block and the second block.

In another embodiment, a method is disclosed of performing concurrent write and verify operations in an analog neural memory comprising a first block comprising two or more banks of non-volatile memory cells and a second block comprising two or more banks of non-volatile memory cells, the method comprising concurrently performing a write operation on one of the first block and the second block and a read operation on the other of the first block and the second block.

In another embodiment, a method is disclosed of performing concurrent write and verify or read operations in a neural network comprising multiple vector multiplication by matrix (VMM) arrays of memory cells, the method comprising concurrently performing a write operation and a verify or read operation on different VMM arrays.

BRIEF DESCRIPTION OF THE DRAWINGS

FIG. 2 depicts a prior art split gate flash memory cell.

FIG. 3 depicts another prior art split gate flash memory cell

FIG. 4 depicts another prior art split gate flash memory cell.

FIG. 5 depicts another prior art split gate flash memory cell.

FIG. 6 depicts another prior art split gate flash memory cell.

FIG. 7 depicts a prior art stacked gate flash memory cell.

FIG. 18B depicts a VMM system comprising four banks organized into one block.

FIG. 19 depicts control signals and circuitry for concurrent write and verify operations on a bank-by-bank basis.

FIG. 20 depicts control signals and circuitry for concurrent write and verify operations on a block-by-block basis.

DETAILED DESCRIPTION OF THE INVENTION

The VMM systems of an analog neural network of the present invention utilize a combination of CMOS technology and non-volatile memory arrays.

Embodiments of Improved VMM Systems

Figure 1:
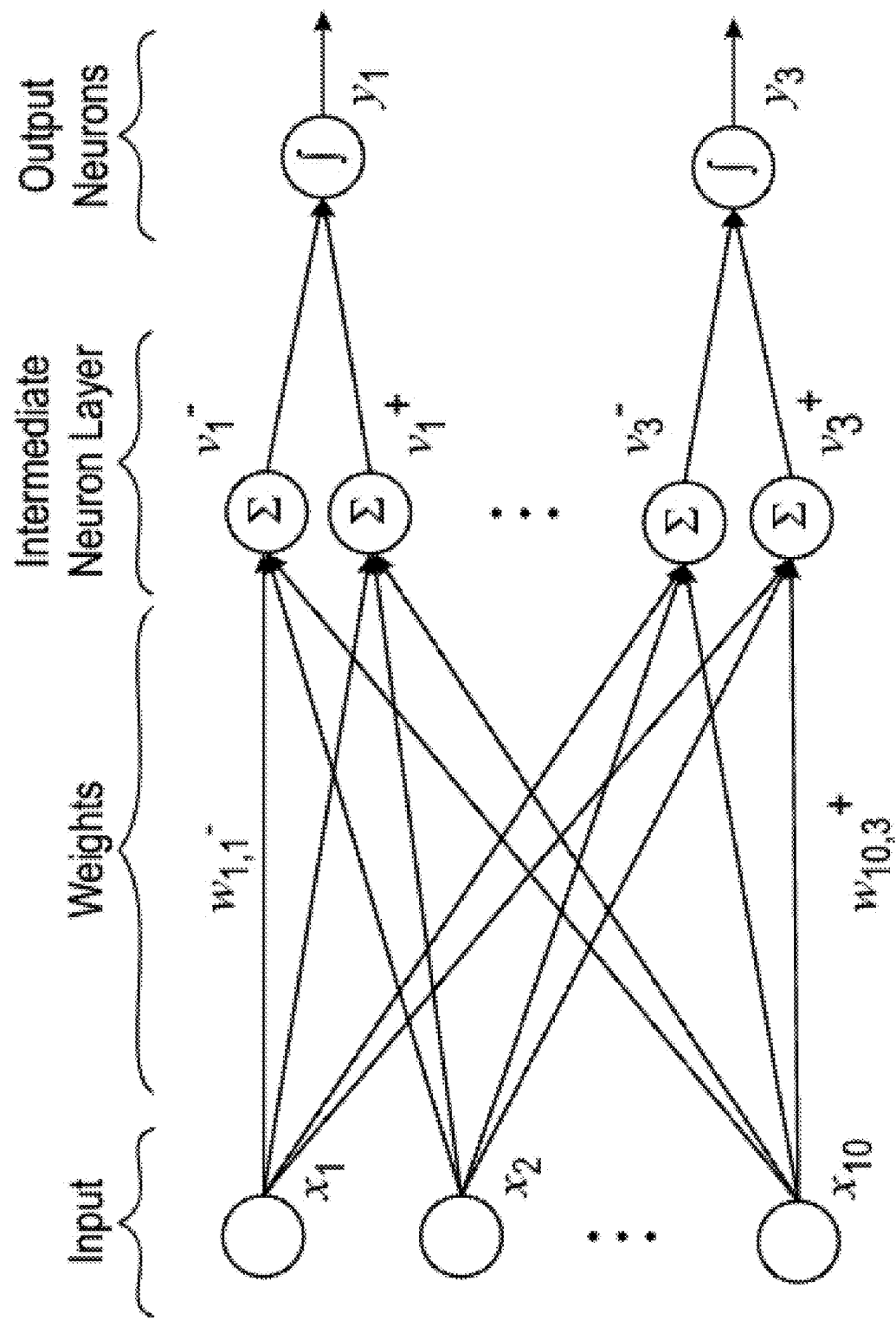
FIG. 1 depicts a prior art artificial neural network.
Figure 8:
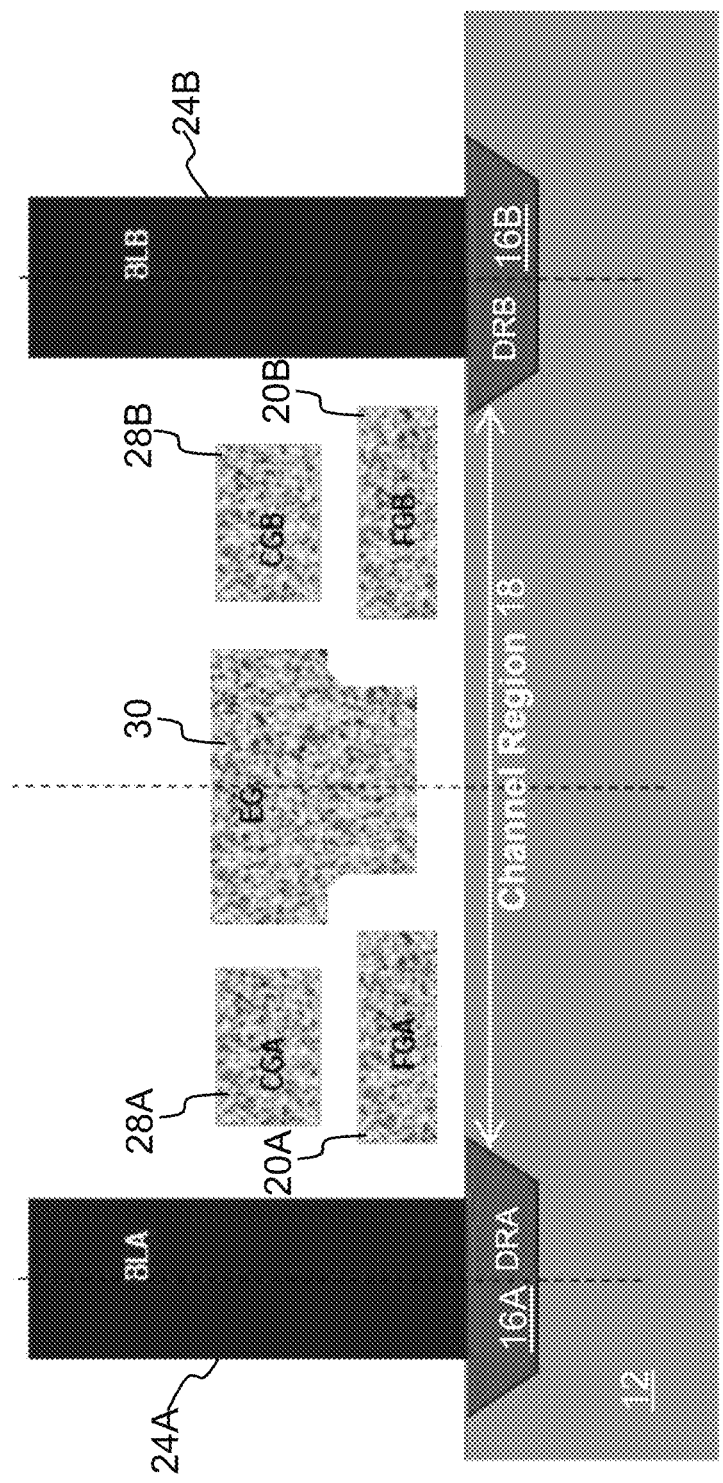
FIG. 8 depicts a twin split-gate memory cell.
Figure 9:
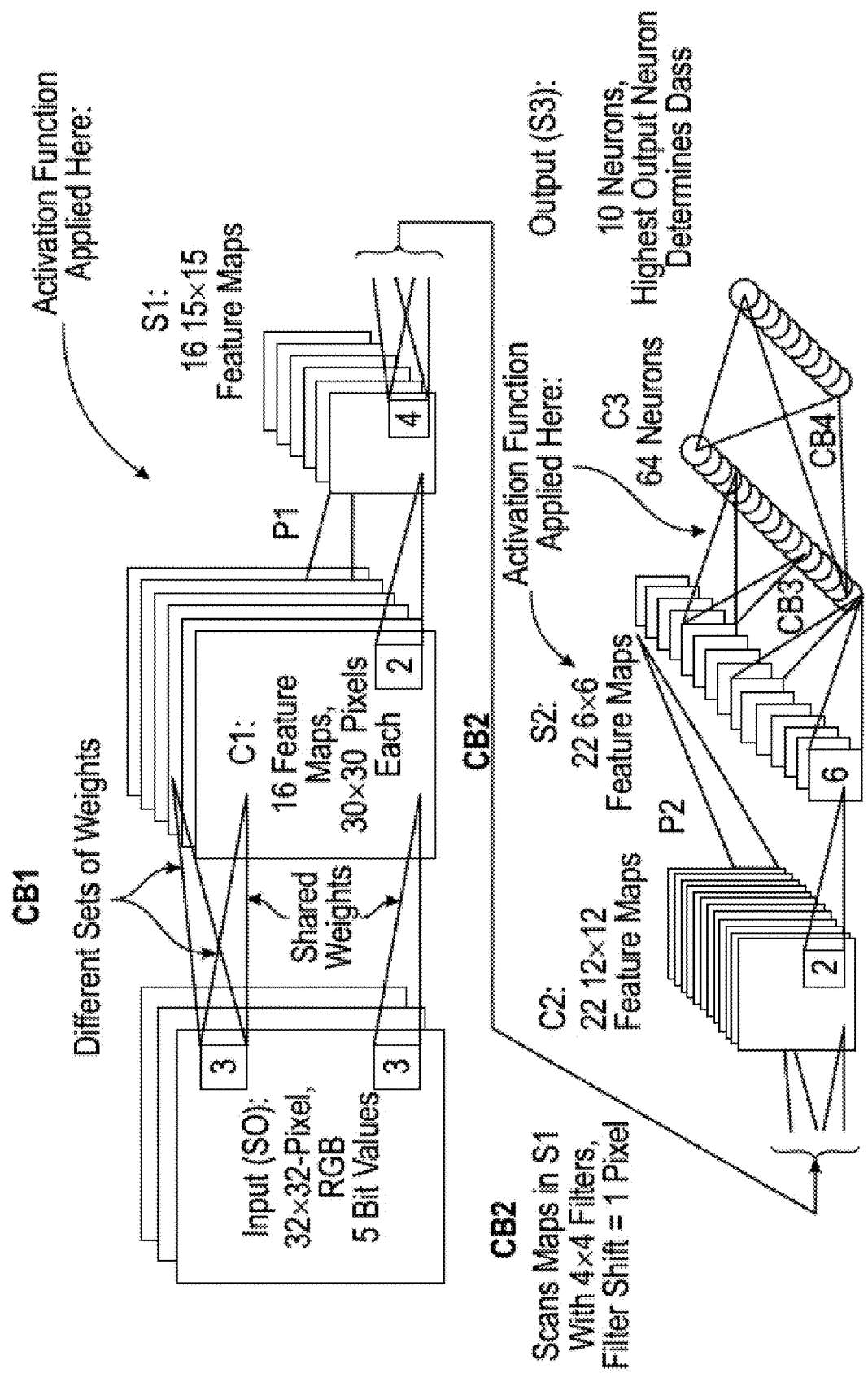
FIG. 9 depicts different levels of an exemplary artificial neural network utilizing one or more VMM arrays.
Figure 10:
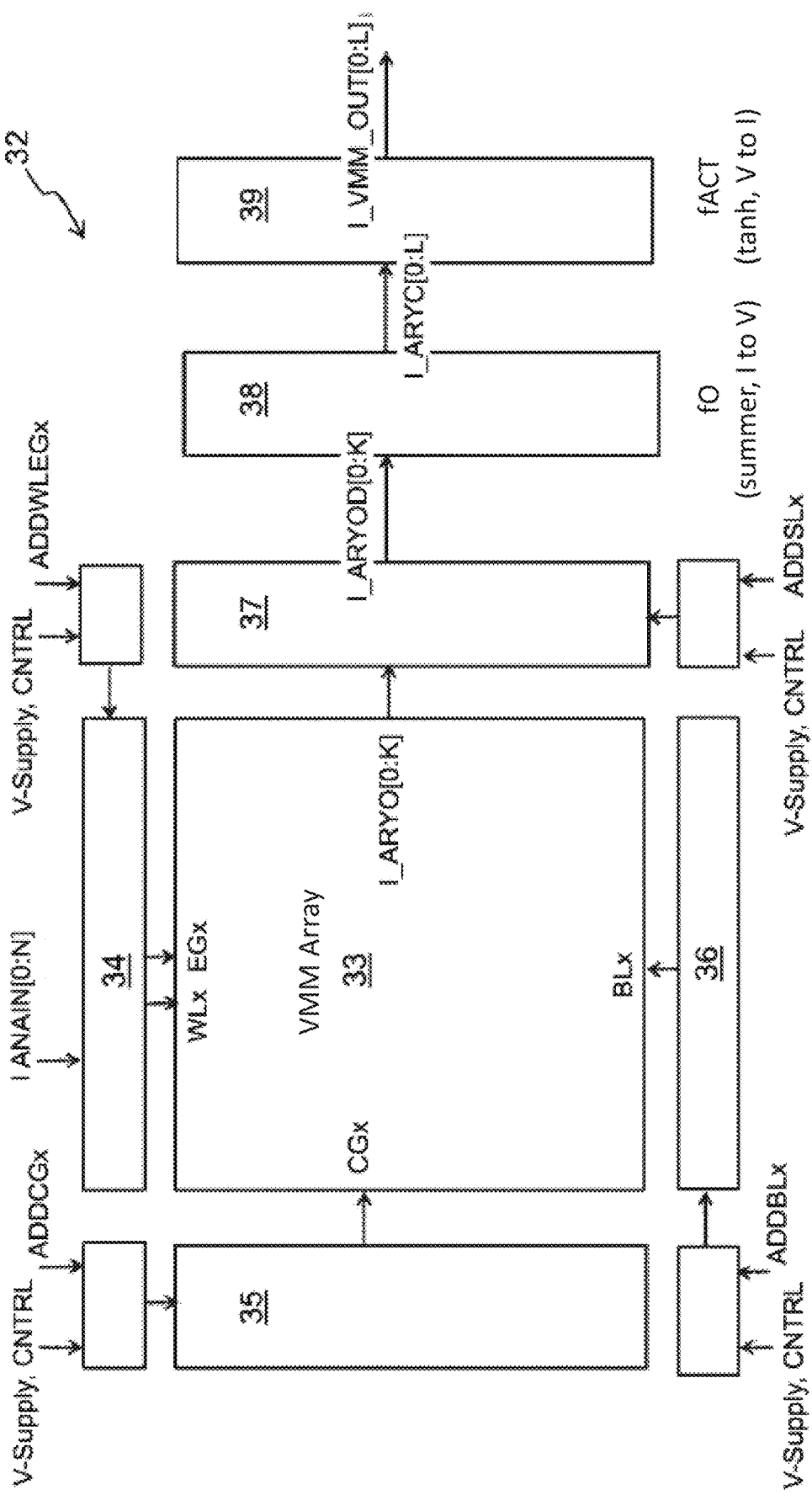
FIG. 10 depicts a VMM system comprising a VMM array and other circuitry.
Figure 11:
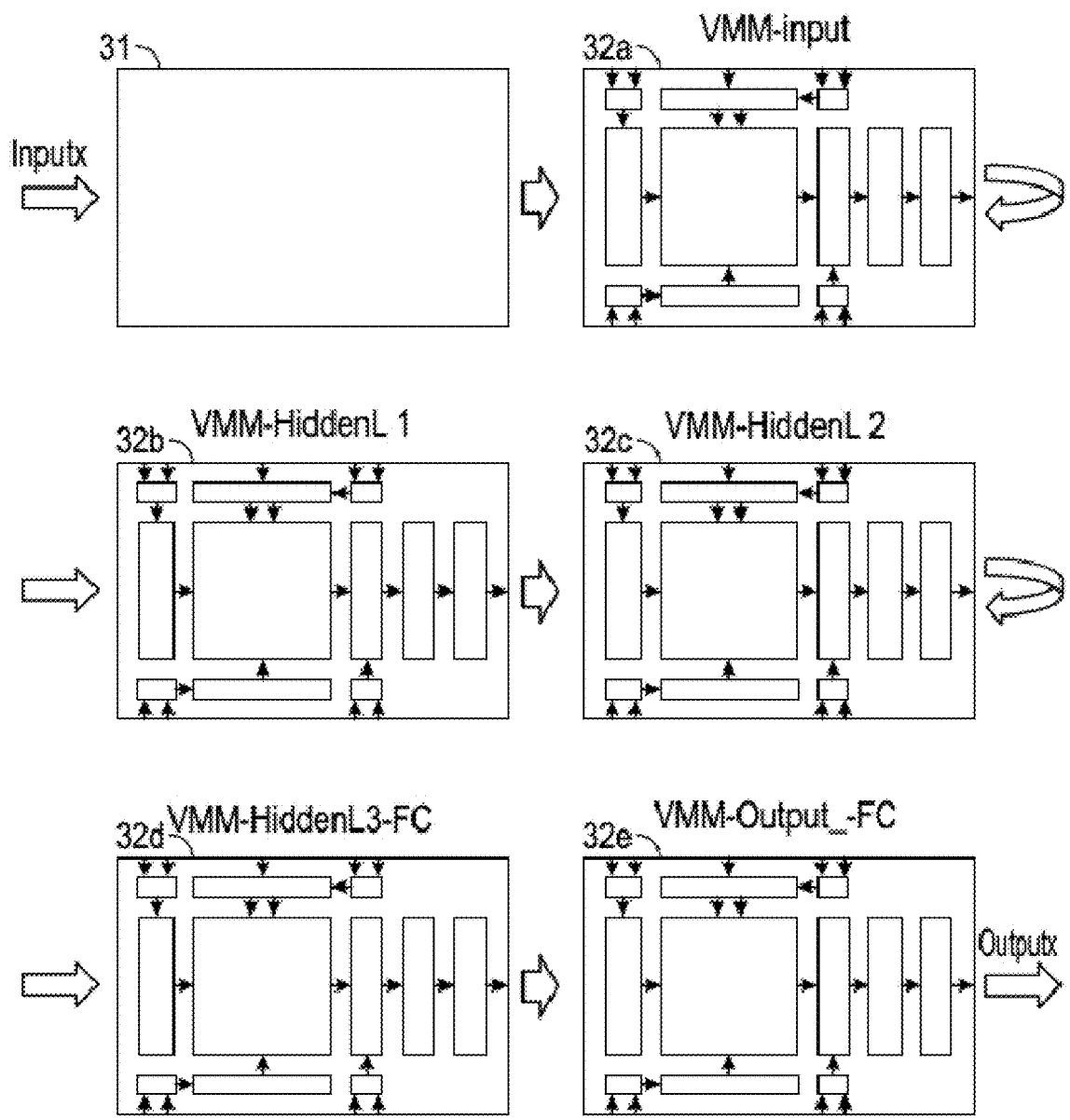
FIG. 11 depicts an exemplary artificial neural network utilizing one or more VMM systems.
Figure 12:
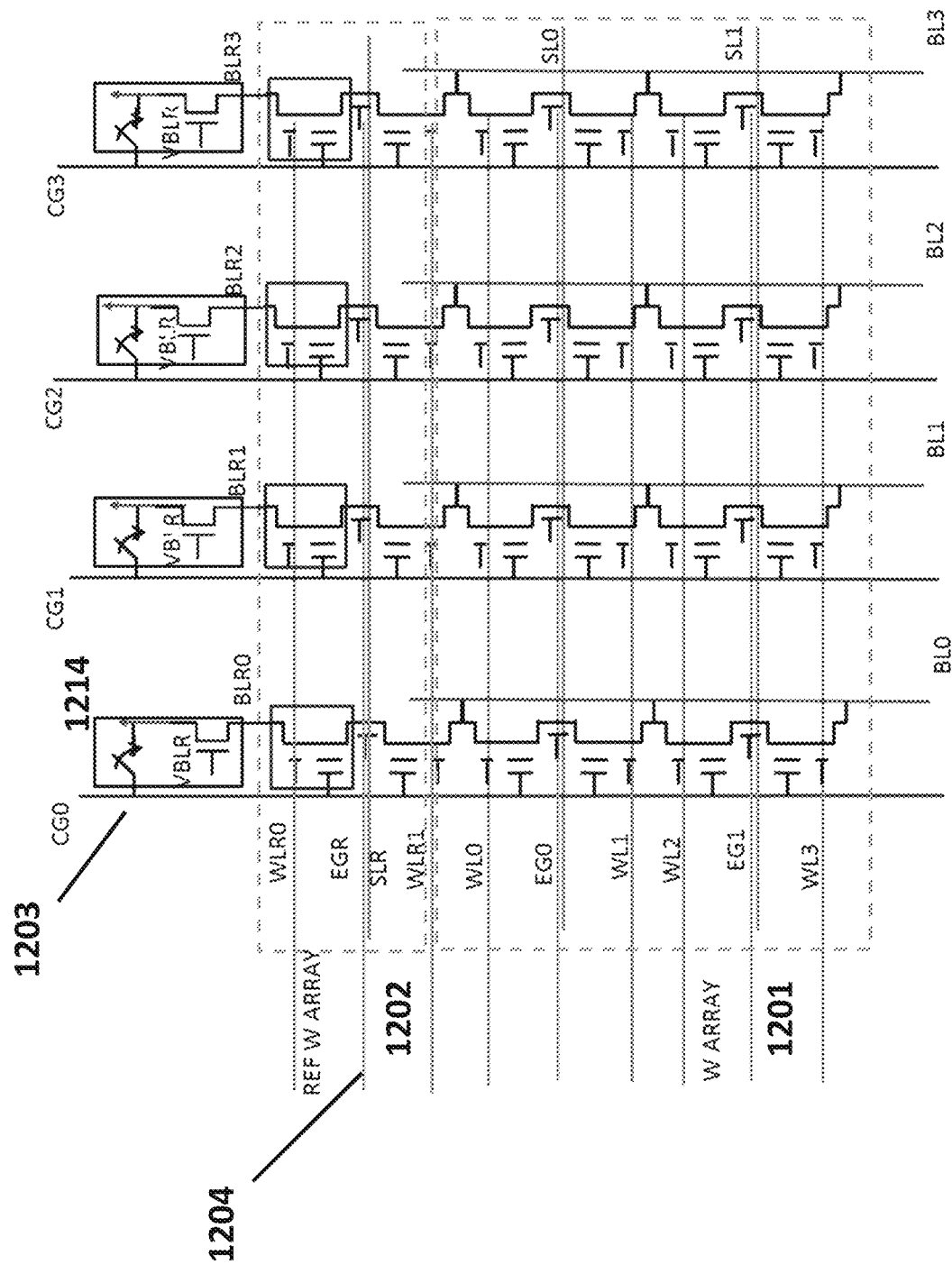
FIG. 12 depicts an embodiment of a VMM array.
Figure 13:
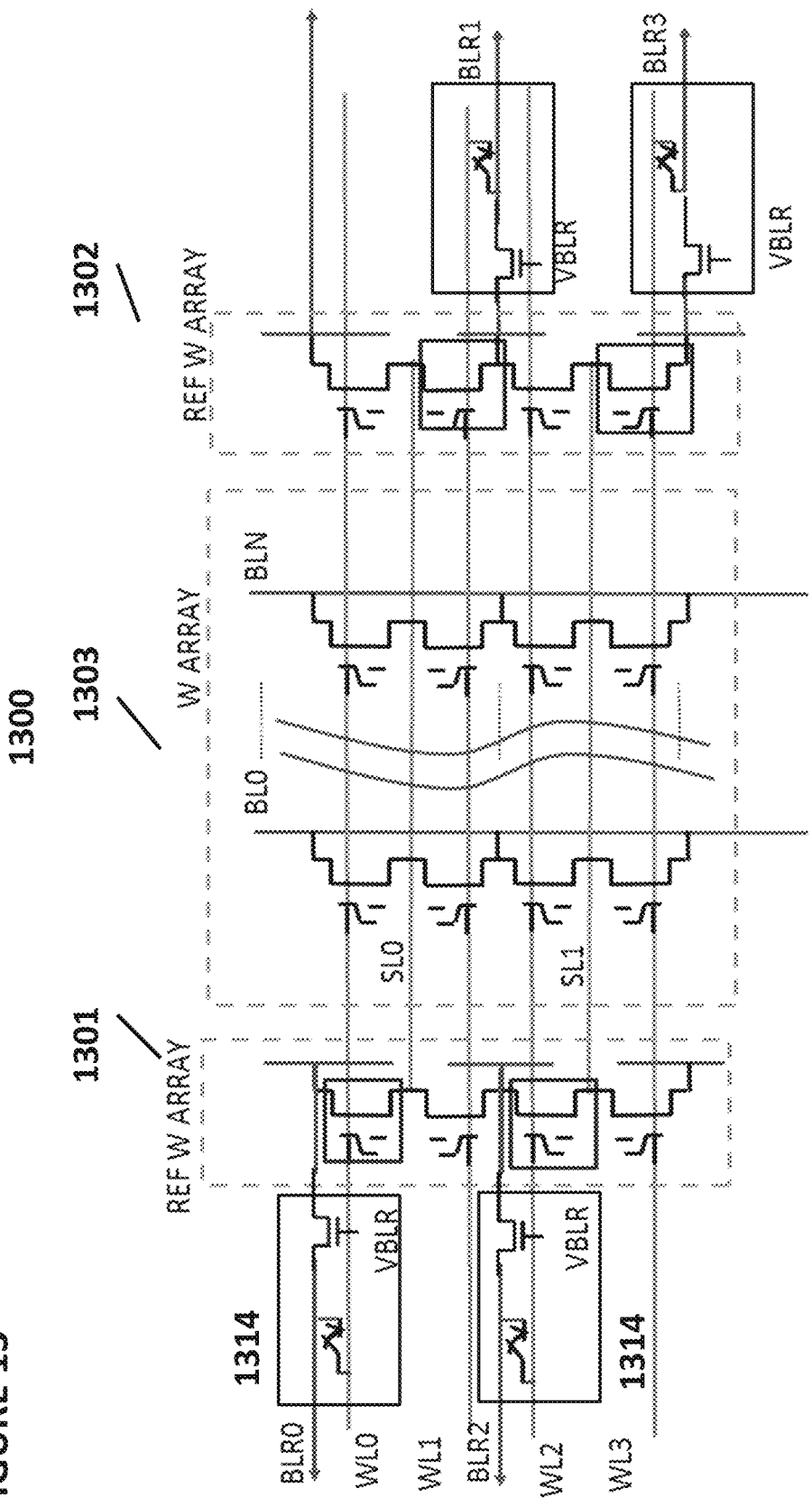
FIG. 13 depicts another embodiment of a VMM array.
Figure 14:
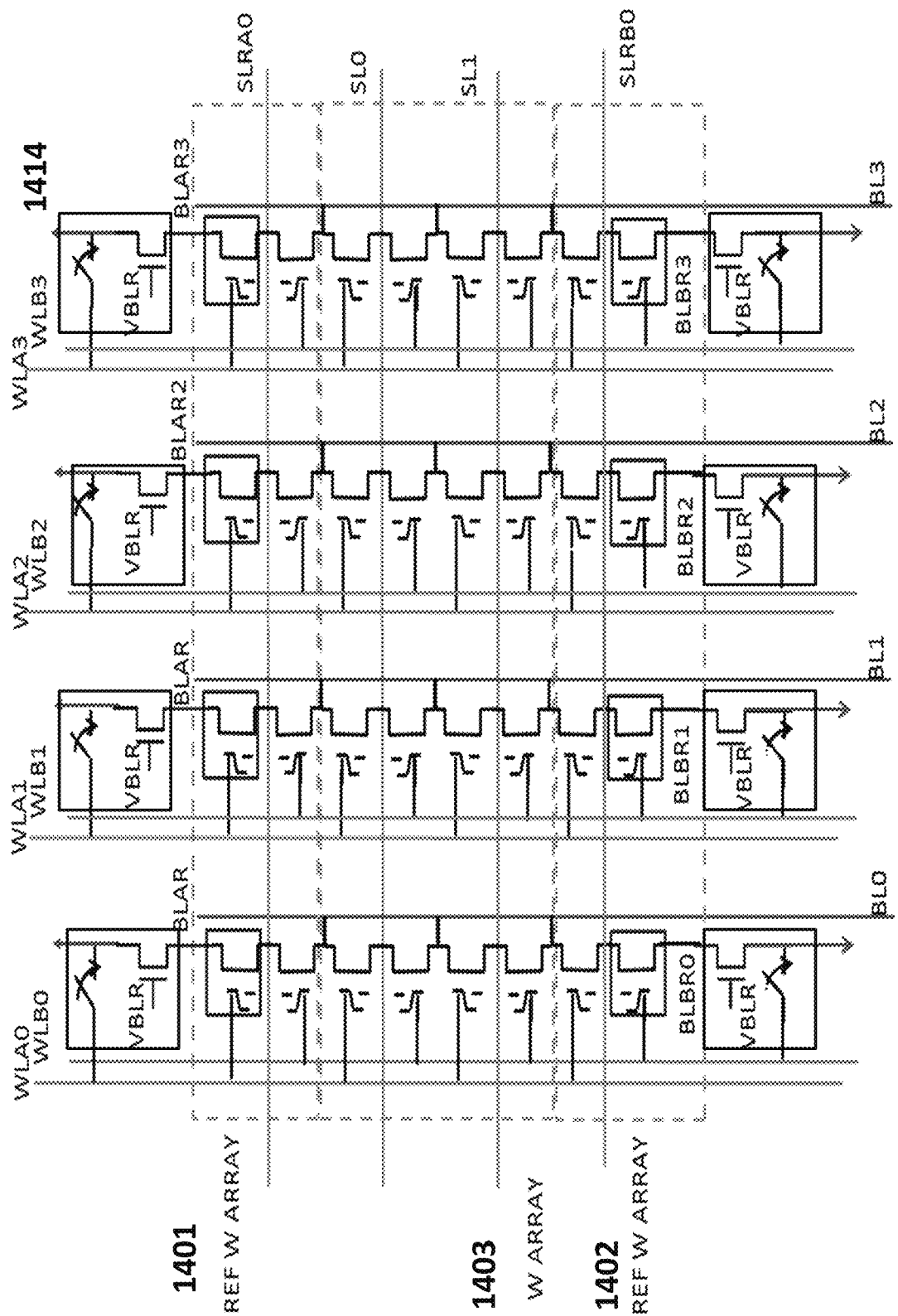
FIG. 14 depicts another embodiment of a VMM array.
Figure 15:
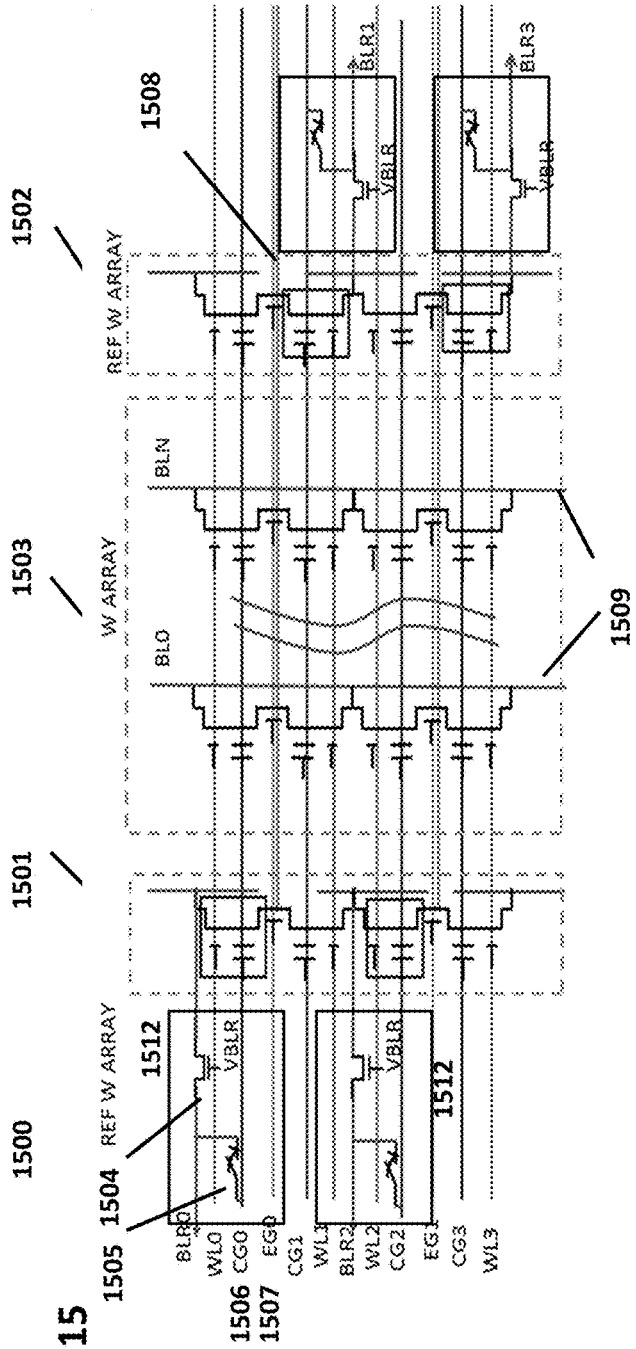
FIG. 15 depicts another embodiment of a VMM array.
Figure 16:
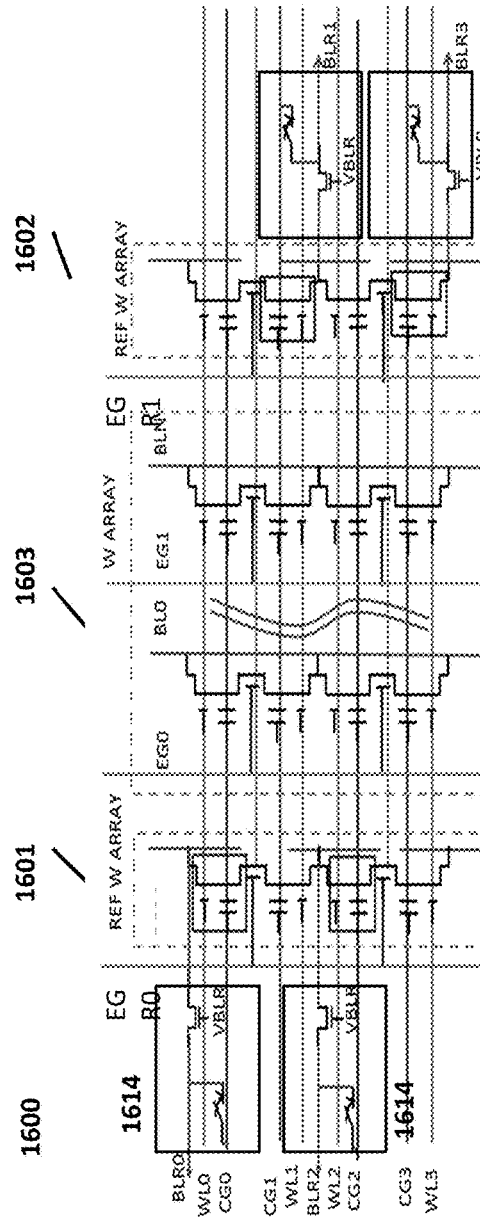
FIG. 16 depicts another embodiment of a VMM array.
Figure 17A:
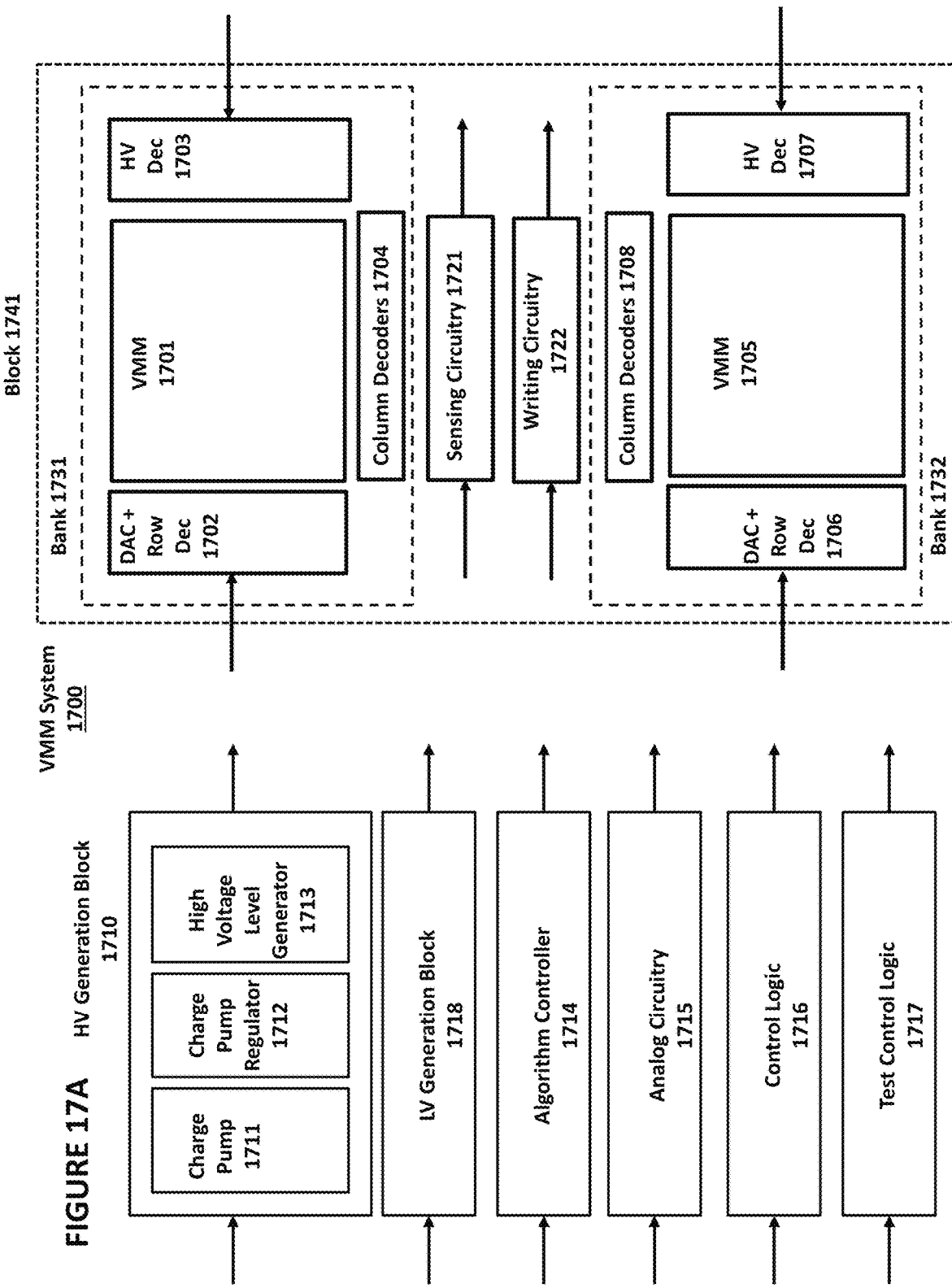
FIG. 17A depicts a VMM system comprising two banks.

FIG. 17A depicts a block diagram of VMM system 1700. VMM system 1700 comprises bank 1731 and bank 1732. Bank 1731 comprises VMM array 1701, DAC (digital-to-analog converter) and row decoders (row input circuit) 1702, high voltage decoders 1703, and column decoders 1704. Bank 1732 comprises VMM array 1705, DAC and row decoders 1706, high voltage decoders 1707, and column decoders 1708. The DAC of the DAC and row decoders 1702 is used to convert row input digital bits into an analog bias/timing to be applied to the row input of the VMM array 1701 such as during neural read (inference operation of a neural network).

VMM system 1700 further comprises high voltage HV generation block 1710, which comprises charge pump 1711, charge pump regulator 1712, and high voltage level generator 1713. VMM system 1700 further comprises low voltage LV generation block 1718, algorithm controller 1714, analog circuitry 1715, control logic 1716, and test control logic 1717.

Figure 17B:
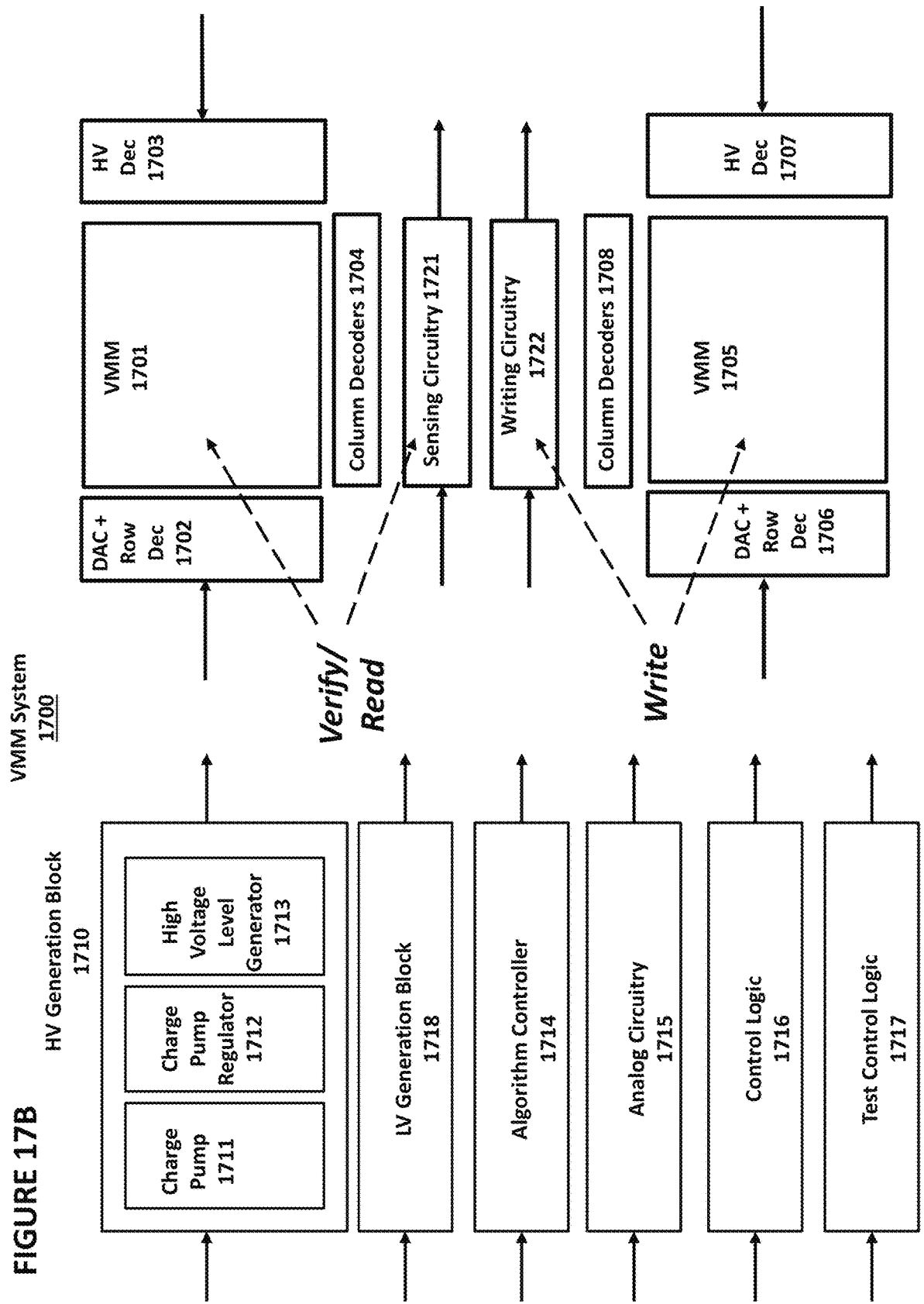
FIG. 17B depicts the VMM system of FIG. 17A where a first bank is being verified and a second bank is being written.
Figure 17C:
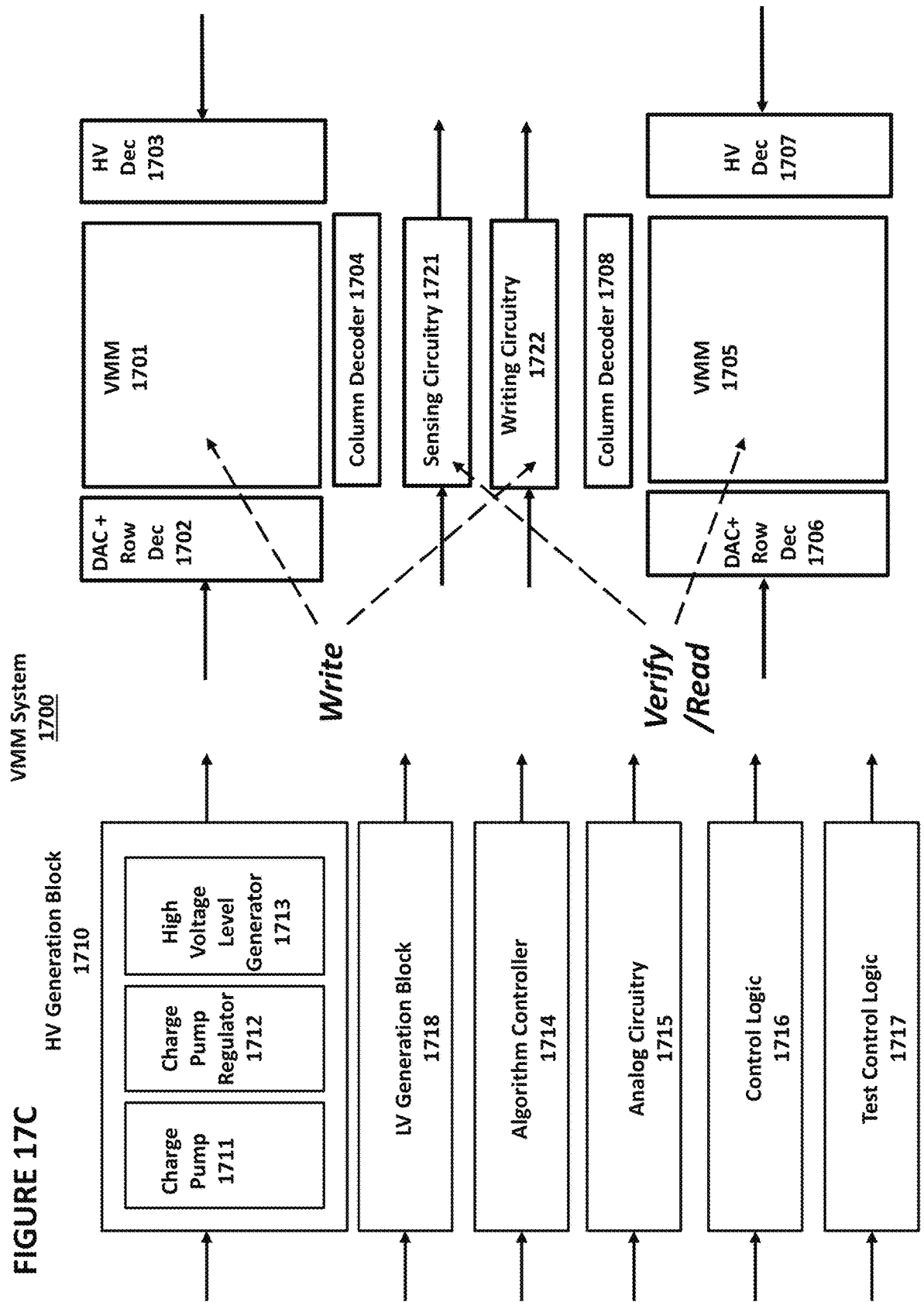
FIG. 17C depicts the VMM system of FIG. 17A where the first bank is being written and the second bank is being verified.

VMM system 1700 further comprises sensing circuitry (bit line/column output circuit) 1721 and (column) writing circuitry 1722, both of which are shared by VMM 1701 and VMM 1705. The sensing circuitry 1721 includes circuitry for verify and for neural read (for inference, such as including analog-to-digital ADC circuits). The writing circuitry 1722 controls programming/erasing of the memory cell to a weight target (a cell current target) such as controlling the bit line bias voltage or program current levels. Thus, in FIG. 17B, sensing circuitry 1721 is coupled to VMM array 1701 during a verify or read operation of VMM array 1701, and writing circuitry 1722 is coupled to VMM array 1705 during a writing operation (program or erase) of VMM array 1705. Similarly, in FIG. 17C, sensing circuitry 1721 is coupled to VMM array 1705 during a verify or read operation of VMM array 1705, and writing circuitry 1722 is coupled to VMM array 1701 during a writing operation of VMM array 1701.

With reference again to FIG. 17A, block 1741 is a logical unit comprising bank 1731, bank 1732, sensing circuitry 1721, and writing circuitry 1722.

Figure 18A:
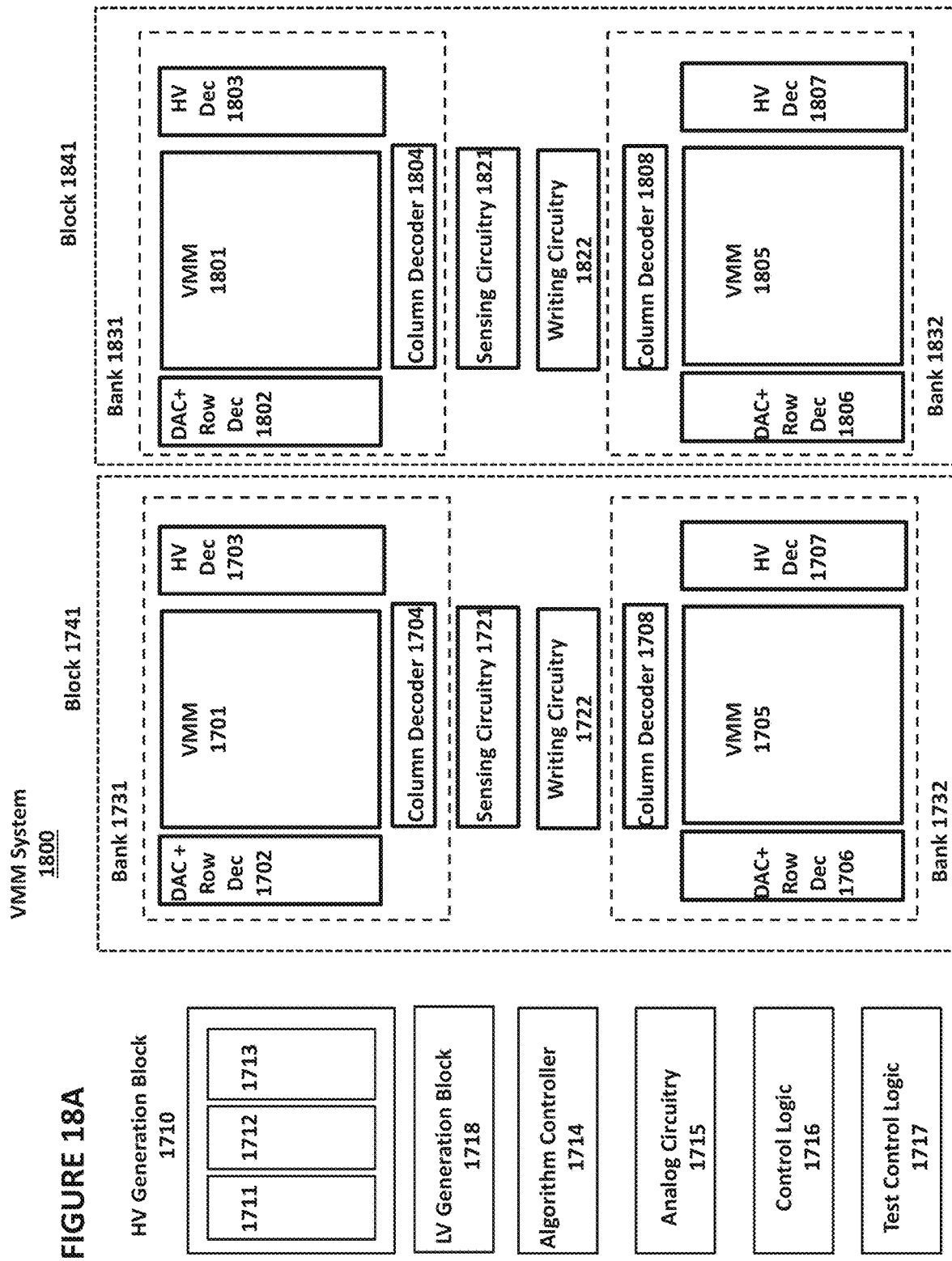
FIG. 18A depicts a VMM system comprising four banks organized into two blocks.

FIG. 18A depicts VMM system 1800, which is a variation of VMM system 1700 from FIG. 17. VMM system 1800 comprises the same components as VMM system 1700 with twice as many VMM arrays and associated circuitry. While VMM system 1800 is depicted having twice as many VMM arrays, this is not meant to be limiting in any way, and any number of VMM arrays may be provided without exceeding the scope. Thus, VMM system 1800 further comprises bank 1831 and bank 1832. Bank 1831 comprises VMM array 1801, DAC and row decoders (row input circuit) 1802, high voltage decoders 1803, and column decoders 1804. Bank 1832 comprises VMM array 1805, DAC and row decoders 1806, high voltage decoders 1807, and column decoders 1808. VMM system 1800 further comprises sensing circuitry 1821 and writing circuitry 1822, both of which are shared by VMM 1801 and VMM 1805.

High voltage generation block 1710, low voltage generation block 1718, algorithm controller 1714, analog circuitry 1715, control logic 1716, and test control logic 1717 are shared by VMM arrays 1701, 1705, 1801, and 1805.

Block 1841 is a logical unit comprising bank 1831, bank 1832, sensing circuitry 1821, and writing circuitry 1822.

FIG. 18B again depicts VMM system 1800. Here, block 1851 is a logical unit comprising banks 1731, 1732, 1831, and 1832; sensing circuitry 1721 and 1821; and writing circuitry 1722 and 1822. Thus, as used herein, a "block" can consist of two banks or more than two banks.

FIG. 19 depicts control signals 1900 for performing concurrent verify and write operations across multiple banks, such as those shown in FIGS. 17-18, which can be used in an analog neural memory system. Control signals 1900 are generated by a combination of control logic 1716, algorithm controller 1714, high voltage generation block 1710 and low voltage generation block 1718, which can be referred to together, or in part, as control circuitry 1903. In this example, the banks are divided into sets—set 1901 (which comprises a first bank and possibly other banks) and set 1902 (which comprises a second bank and possibly other banks). In response to control signals 1900, when set 1901 of banks is being written (denoted wrt) using writing circuitry (such as writing circuitry 1722 or 1822, not shown), set 1902 of banks is being verified (read) (denoted vfy) using sensing circuitry (such as sensing circuitry 1721 or 1821, not shown). In response to control signals 1900, when set 1901 of banks is being verified (or read), set 1902 of banks is being written (programmed or erased). By operating concurrently on the banks instead of sequentially, the total amount of time for the program and verify process is cut by as much as half.

FIG. 20 depicts control signals 2000 for performing concurrent verify and write operations across multiple banks. Control signals 2000 comprising control signals 2010 and 2020 are generated by a combination of control logic 1716, algorithm controller 1714, high voltage generation block 1710 and low voltage generation block 1718, which again can be referred to together or in part as control circuitry 1903. In this example, the banks are divided into sets—set 2001 (which, for example, can comprise a first bank and possibly other banks), set 2002 (which, for example, can comprise a second bank and possibly other banks), set 2003 (which, for example, can comprise a third bank and possibly other banks) and set 2004 (which, for example, can comprise a fourth bank and possibly other banks). In response to control signals 2010, when set 2001 of banks is being written using writing circuitry (such as writing circuitry 1722 or 1822, not shown), set 2002 of banks is being verified (or read) using sensing circuitry (such as sensing circuitry 1721 or 1821, not shown). In response to control signals 2010, when set 2001 of banks is being verified (or read), set 2002 of banks is being written and when set 2001 of banks is being written, set 2002 of banks is being verified (or read). In response to control signals 2020, when set 2003 of banks is being written and verified (or read), set 2004 of banks is being read such as for inference neural network operation (or verify), and when set 2003 of banks is being written, set 2004 of banks is being verified (or read). By operating concurrently on the blocks instead of sequentially, the total amount of time for the program and verify process is cut by as much as half. And by operating concurrently on the blocks, some portion of neural networks can perform neural read (for inference) while others are performing write operations, such as for weight update.

Figure 21:
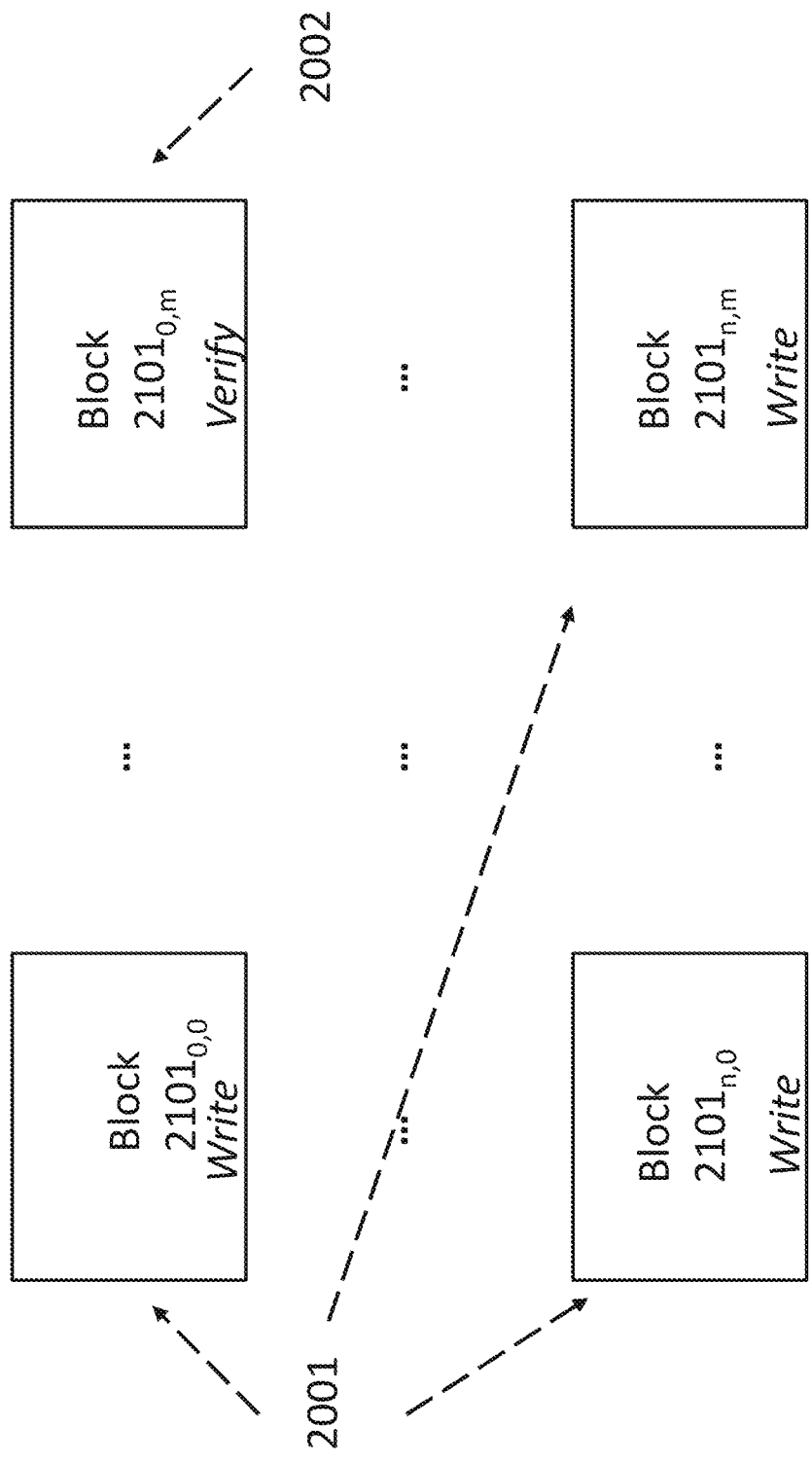
FIG. 21 depicts a VMM system configured for concurrent write and verify operations on a block-by-block basis.

An example of the implementation of FIG. 20 is shown in FIG. 21. VMM system 2100 comprises an array of blocks, with the first row of the array of blocks comprising blocks $2101_{0,0}, \ldots, 2101_{0,m}$, and the last row of the array of blocks comprising blocks $2101_{0,0}, \ldots, 2101_{n,m}$, where m is an integer number of columns of blocks in VMM system 2100 and n is an integer number of rows of blocks in VMM system 2100. In this example, blocks $2101_{0,0}$, $2101_{n,0}$, $2101_{n,m}$ (as well as certain other blocks in the array that are not shown) are in set 2001 of blocks, and block $2101_{0,m}$ (as well as certain other blocks in the array that are not shown) are in set 2002 of blocks, with reference to FIG. 20. At the particular moment in time captured in FIG. 21, the blocks in set 2001 (which can comprise, for example, a first block comprising two or more banks of non-volatile memory cells, each bank comprising an array of non-volatile memory cells) are being written, and the blocks in set 2002 (which can comprise, for example, a second block comprising two or more banks of non-volatile memory cells, each bank comprising an array of non-volatile memory cells) are being verified (read).

Figure 22:
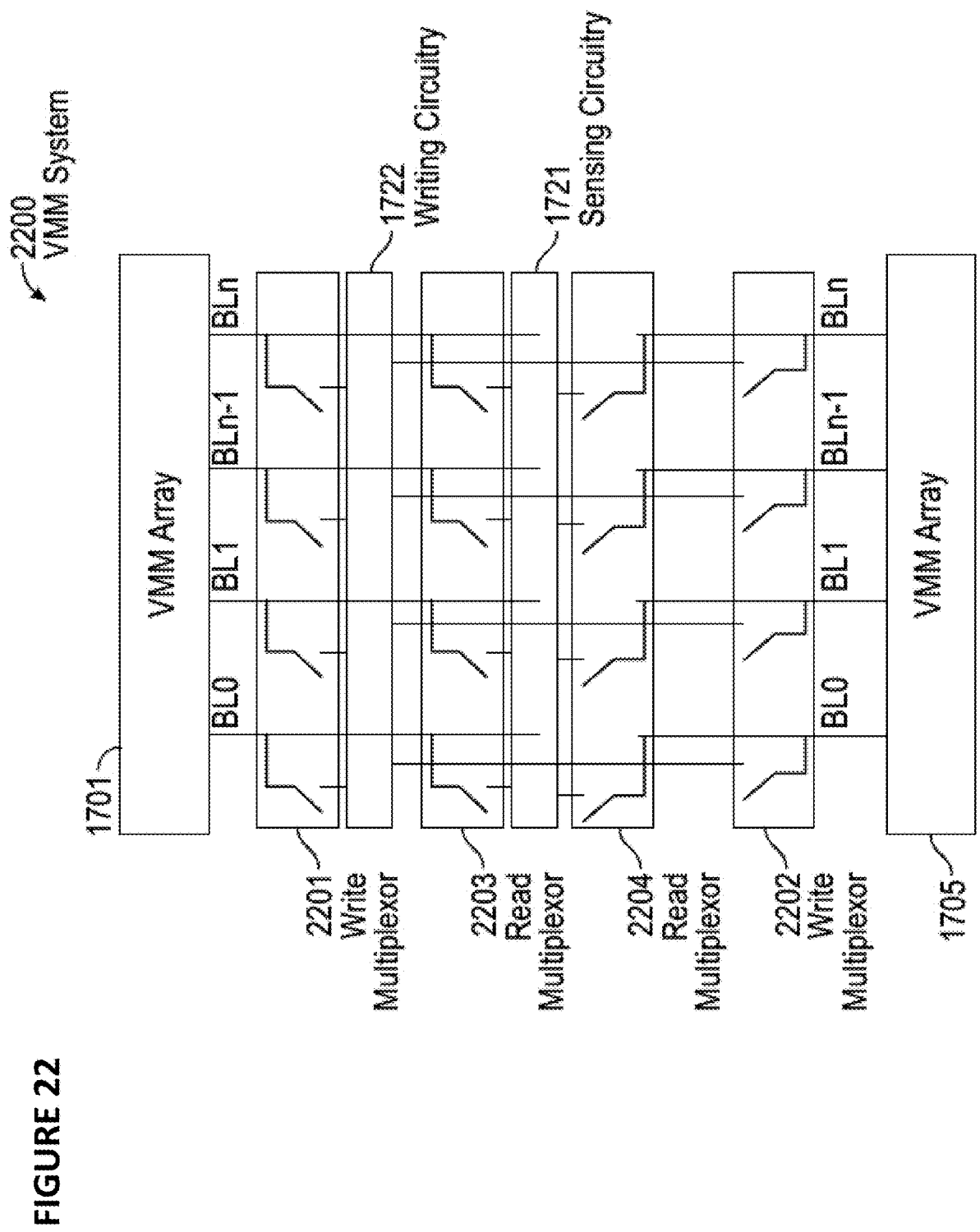
FIG. 22 depicts a VMM system configured for concurrent write and verify operations on a bank-by-bank basis.

An example of the implementation of FIG. 17A is shown in FIG. 22. VMM system 2200 comprises VMM arrays 1701 and 1705; sensing circuitry 1721; writing circuitry 1722; first and second write multiplexors 2201 and 2202; and first and second read (verify) multiplexors 2203 and 2204. First write multiplexor 2201, when enabled, couples VMM array 1701 to writing circuitry 1722. Second write multiplexor 2202, when enabled, couples VMM array 1705 to writing circuitry 1722. First read multiplexor 2203, when enabled, couples VMM array 1701 to sensing circuitry 1721. Second read multiplexor 2204, when enabled, couples VMM array 1705 to sensing circuitry 1721. The above has been described with two write multiplexors, and two read multiplexors, it being understood that this is not meant to be limiting. A single multiplexor may be used in place of the two separate multiplexors, without exceeding the scope.

Figure 23:
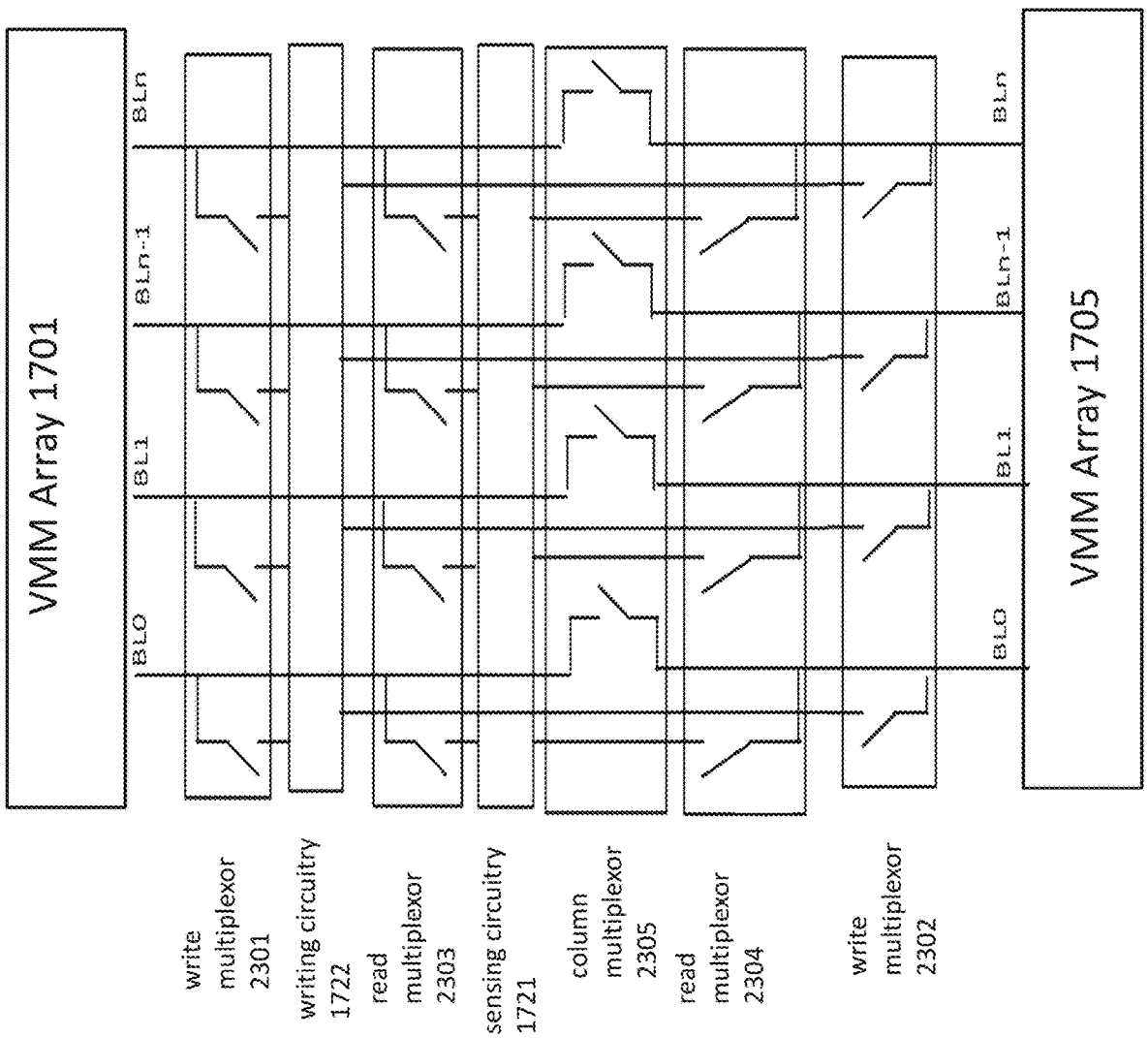
FIG. 23 depicts another VMM system configured for concurrent write and verify operations on a bank-by-bank basis.

Another example of the implementation of FIG. 17A is shown in FIG. 23. VMM system 2300 comprises VMM arrays 1701 and 1705; sensing circuitry 1721; writing circuitry 1722; first and second write multiplexors 2301 and 2302; first and second read (verify) multiplexors 2303 and 2304; and column multiplexor 2305. First write multiplexor 2301, when enabled, couples VMM array 1701 to writing circuitry 1722. Second write multiplexor 2302, when enabled, couples VMM array 1705 to writing circuitry 1722. First read multiplexor 2303, when enabled, couples VMM array 1701 to sensing circuitry 1721. Second read multiplexor 2304, when enabled, couples VMM array 1705 to sensing circuitry 1721. Column multiplexor 2305, when enabled, connects bit lines in VMM array 1701 to bit lines in VMM array 1705, so that both VMM arrays 1701 and 1705 are then coupled to the same bit lines and can be controlled as a single array. The above has been described with two write multiplexors, and two read multiplexors, it being understood that this is not meant to be limiting. A single multiplexor may be used in place of the two separate multiplexors, without exceeding the scope.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. An analog neural memory system comprising:
   a first bank comprising a first array of non-volatile memory cells;
   a second bank comprising a second array of non-volatile memory cells;
   writing circuitry shared by the first bank and the second bank and selectively coupled to the first bank by a first write multiplexor and selectively coupled to the second bank by a second write multiplexor;
   sensing circuitry shared by the first bank and the second bank and selectively coupled to the first bank by a first read multiplexor and selectively coupled to the second bank by a second read multiplexor;
   a column multiplexor to connect, when enabled, bit lines in the first array to bit lines in the second array to enable control of the first array and the second array as a single array; and
   control circuitry for concurrently performing a write operation using the writing circuitry on one of the first bank and the second bank and a verify operation using the sensing circuitry on the other of the first bank and the second bank.

2. The system of claim 1, wherein the first bank comprises a third array of non-volatile memory cells and the second bank comprises a fourth array of non-volatile memory cells.

3. The system of claim 1, wherein the non-volatile memory cells in the first bank and the non-volatile memory cells in the second bank are stacked gate non-volatile memory cells.

4. The system of claim 1, wherein the non-volatile memory cells in the first bank and the non-volatile memory cells in the second bank are split-gate non-volatile memory cells.

5. A method of performing concurrent write and verify operations in an analog neural memory comprising a first bank comprising a first array of non-volatile memory cells and a second bank comprising a second array of non-volatile memory cells, the method comprising:
   concurrently performing a write operation on one of the first bank and the second bank and a verify operation on the other of the first bank and the second bank; and
   enabling a column multiplexor to connect bit lines of the first array to bit lines of the second array;
   controlling the first array and the second array as a single array.

6. The method of claim 5, wherein the first bank comprises a third array of non-volatile memory cells and the second bank comprises a fourth array of non-volatile memory cells.

7. The method of claim 5, wherein the non-volatile memory cells in the first bank and the non-volatile memory cells in the second bank are stacked gate non-volatile memory cells.

8. The method of claim 5, wherein the non-volatile memory cells in the first bank and the non-volatile memory cells in the second bank are split-gate non-volatile memory cells.

\* \* \* \* \*